US012567382B2

(12) United States Patent
Kim et al.

(10) Patent No.: US 12,567,382 B2
(45) Date of Patent: Mar. 3, 2026

(54) DATA DRIVER CONFIGURED TO PROVIDE DIFFERENT GAMMA SIGNALS TO RESPECTIVE AREAS AND DISPLAY DEVICE INCLUDING THE SAME

(71) Applicant: LG Display Co., Ltd., Seoul (KR)

(72) Inventors: Haksu Kim, Daegu (KR); SeongHo Cho, Gumi-si (KR); HwanJoo Lee, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 100 days.

(21) Appl. No.: 18/414,110

(22) Filed: Jan. 16, 2024

(65) Prior Publication Data

US 2024/0257769 A1      Aug. 1, 2024

(30) Foreign Application Priority Data

Jan. 31, 2023    (KR) ........................ 10-2023-0012782

(51) Int. Cl.
| | |
|---|---|
| *G09G 3/3291* | (2016.01) |
| *G09G 3/20* | (2006.01) |
| *G09G 3/3233* | (2016.01) |
| *H10K 59/80* | (2023.01) |

(52) U.S. Cl.
CPC ......... *G09G 3/3291* (2013.01); *G09G 3/2007* (2013.01); *G09G 3/3233* (2013.01); *H10K 59/879* (2023.02); *G09G 2300/0842* (2013.01); *G09G 2300/0861* (2013.01); *G09G 2320/028* (2013.01); *G09G 2320/0673* (2013.01); *G09G 2320/0686* (2013.01); *G09G 2380/10* (2013.01)

(58) Field of Classification Search
CPC .................................................... H10K 59/879
See application file for complete search history.

(56) References Cited

U.S. PATENT DOCUMENTS

| | | | |
|---|---|---|---|
| 2006/0244697 A1 | 11/2006 | Lee et al. | |
| 2011/0284881 A1 | 11/2011 | Shikina et al. | |
| 2019/0180664 A1 | 6/2019 | Sun et al. | |
| 2020/0388206 A1* | 12/2020 | Bae ...................... | G09G 3/2003 |

(Continued)

FOREIGN PATENT DOCUMENTS

| | | |
|---|---|---|
| JP | 2004-264515 A | 9/2004 |
| JP | 2005-92075 A | 4/2005 |
| JP | 2010-44250 A | 2/2010 |

(Continued)

*Primary Examiner* — Gustavo Polo
(74) *Attorney, Agent, or Firm* — Birch, Stewart, Kolasch & Birch, LLP

(57) ABSTRACT

A display device can include a display panel including a first area configured to operate in a first mode, and a second area configured to operate in the first mode or a second mode, and at least one data driver connected to the display panel and configured to output a first gamma signal corresponding to the first mode to the first area and, output one of the first gamma signal and a second gamma signal corresponding to the second mode to the second area. Also, the display panel includes a pixel circuit including a first light emitting element, a second light emitting element, and a plurality of transistors, a first lens disposed on the first light emitting element, and a second lens disposed on the second light emitting element, the second lens having a different shape than the first lens.

26 Claims, 17 Drawing Sheets

(56)     References Cited

U.S. PATENT DOCUMENTS

2022/0358875  A1     11/2022  Won et al.
2024/0205560  A1*     6/2024  Shin ..................... H04N 23/672

FOREIGN PATENT DOCUMENTS

| | | | |
|---|---|---|---|
| JP | 2013-89074 | A | 5/2013 |
| JP | 2013-160999 | A | 8/2013 |
| KR | 10-2021-0130308 | A | 11/2021 |
| WO | WO 2011/145174 | A1 | 11/2011 |

* cited by examiner

DATA DRIVER CONFIGURED TO PROVIDE DIFFERENT GAMMA SIGNALS TO RESPECTIVE AREAS AND DISPLAY DEVICE INCLUDING THE SAME

CROSS-REFERENCE TO RELATED APPLICATIONS

This application claims the benefit of and priority to Korean Patent Application No. 10-2023-0012782 filed on Jan. 31, 2023 in the Republic of Korea, the entire contents of which are hereby expressly incorporated by reference into the present application.

BACKGROUND

Technical Field

The present disclosure relates to a data driver and a display device including the data driver.

Discussion of the Related Art

As technology in modern society develops, display devices are used in various ways to provide information to users. Display devices are included in electronic signs that simply transmit visual information in one direction, as well as various electronic devices that require higher technology to confirm a user input and provide information according to the confirmed input.

For example, display devices can be included in vehicles to provide various types of information to a driver and passengers of the vehicle. However, the display device of the vehicle should display content appropriately so as not to interfere with vehicle operations or distract the driver. For example, there exists a need for a display device that can selectively limit the display of content that may reduce the driver's ability to concentrate on driving while the vehicle is in operation.

SUMMARY OF THE DISCLOSURE

An object to be achieved by the present disclosure is to provide a data driver and a display device having improved display quality by being configured to provide an appropriate gamma signal for each mode of a display panel.

Objects of the present disclosure are not limited to the above-mentioned objects, and other objects, which are not mentioned above, can be clearly understood by those skilled in the art from the following descriptions.

A display device according to an example embodiment of the present disclosure can include a display panel including a first area operating in a first mode and a second area operating in the first mode or a second mode; and at least one data driver connected to the display panel and configured to provide a first gamma signal corresponding to the first mode to the first area and configured to provide one of the first gamma signal and a second gamma signal corresponding to the second mode to the second area, in which the display panel includes a pixel circuit including a first light emitting element, a second light emitting element, and a plurality of transistors; a first lens disposed on the first light emitting element; and a second lens disposed on the second light emitting element.

A data driver according to an example embodiment of the present disclosure can be connected to a display panel and control an operation of the display panel. The data driver can include a gamma signal unit that generates a plurality of first gamma signals corresponding to a first mode of the display panel and mapped to different areas of the display panel, and a plurality of second gamma signals corresponding to a second mode of the display panel and mapped to different areas of the display panel, a gamma switch configured to select an output signal from among the plurality of first gamma signals and the plurality of second gamma signals based on being connected to the gamma signal unit; and an output circuit that provides the selected output signal to the display panel.

Other detailed matters of the example embodiments are included in the detailed description and the drawings.

The data driver and display device according to embodiments of the present disclosure can improve display quality by being configured to provide an appropriate gamma signal for each mode of the display panel.

The effects according to the present disclosure are not limited to the contents exemplified above, and more various effects are included in the present specification.

BRIEF DESCRIPTION OF THE DRAWINGS

The above and other objects, features, and advantages of the present disclosure will become more apparent to those of ordinary skill in the art by describing example embodiments thereof in detail with reference to the attached drawings, which are briefly described below.

FIG. 10 is a conceptual view for explaining the display device according to an example embodiment of the present disclosure.

DETAILED DESCRIPTION OF THE EXAMPLE EMBODIMENTS

Figure 1:
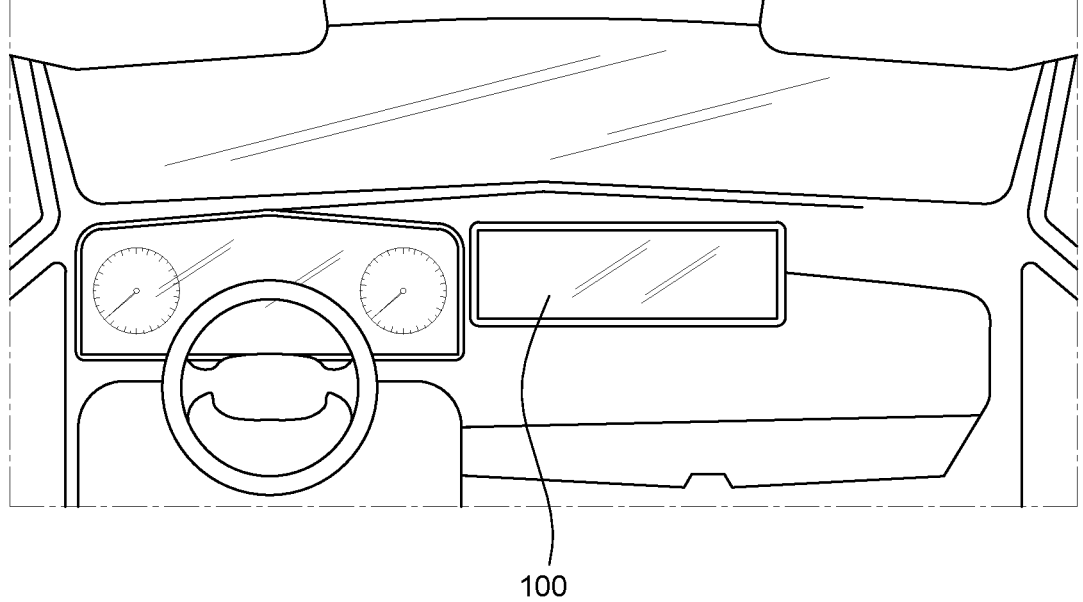
FIG. 1 is an example of a display device according to an example embodiment of the present disclosure.

Most of the terms used herein are general terms that have been widely used in the technical art to which the present disclosure pertains. However, some of the terms used herein can be created reflecting intentions of technicians in this art, precedents, or new technologies. Also, some of the terms used herein can be arbitrarily chosen by the present applicant. In this situation, these terms are defined in detail below. Accordingly, the specific terms used herein should be understood based on the unique meanings thereof and the whole context of the present disclosure.

In the disclosure, 'include' or 'comprise' should be interpreted as that other components can further be included, not excluded, unless otherwise specified.

The expression "at least one of a, b, and c" described throughout the specification can include "a alone," "b alone," "c alone," "a and b," "a and c," "b and c," or "all of a, b, and c." Advantages and features of the present disclosure, and methods for accomplishing the same will be more clearly understood from embodiments described below with reference to the accompanying drawings.

The shapes, areas, ratios, angles, numbers, and the like illustrated in the accompanying drawings for describing example embodiments of the present disclosure are merely examples, and the present disclosure is not limited thereto. Further, in the following description, a detailed explanation of known related technologies can be omitted to avoid unnecessarily obscuring the subject matter of the present disclosure.

The terms such as "including," "having," and "comprising" used herein are generally intended to allow other components to be added unless the terms are used with the term "only." Any references to singular can include plural unless expressly stated otherwise. Components are interpreted to include an ordinary error range even if not expressly stated.

For example, when the position relation between two parts is described using the terms such as "on," "above," "below," and "next," one or more parts can be located between the two parts. When an element or layer is referred to as being "on" another element or layer, it can be directly on the other element or layer, or intervening elements or layers can be present.

Although the terms "first," "second," and the like are used for describing various components, these components are not confined by these terms. These terms are merely used for distinguishing one component from the other components. Therefore, a first component to be mentioned below can be a second component in a technical concept of the present disclosure.

Since an area, a size and a thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways, and the embodiments can be carried out independently of or in association with each other.

In addition, the terms described below are terms defined in consideration of functions in the implementation of the present disclosure, and can vary depending on the intention or custom of a user or operator. Therefore, the definition thereof should be made based on the contents throughout this specification.

Transistors constituting a pixel circuit of the present disclosure can include at least one of oxide TFT (Oxide Thin Film Transistor; Oxide TFT), amorphous silicon TFT (a-Si TFT), and low temperature poly silicon (LTPS) TFT.

Expressions such as "first," "second," and "third" are terms used to distinguish configurations for each embodiment, and the embodiments are not limited to these terms. Therefore, it should be noted that the same terms can refer to different configurations depending on the embodiments.

Hereinafter, embodiments of the present disclosure will be described with reference to the drawings.

FIG. 1 is an example of a display device according to an example embodiment of the present disclosure.

A display device 100 can be disposed on at least a portion of a dashboard of a vehicle. The dashboard of the vehicle includes components disposed in front of the front seats (e.g., a driver seat and a passenger seat) of the vehicle. For example, in the dashboard of the vehicle, input components for operating various functions inside the vehicle (e.g., an air conditioner, an audio system, infotainment system, and a navigation system) can be disposed.

In an example embodiment, the display device 100 can be disposed on the dashboard of the vehicle and operate as an input unit for operating at least some of the various functions of the vehicle. The display device 100 can provide various kinds of information related to the vehicle, such as operation information of the vehicle (e.g., a current speed of the vehicle, a remaining fuel amount, and a driving distance), and information about parts of the vehicle (e.g., damage to vehicle tires, tire pressure, etc.).

In an example embodiment, the display device 100 can be disposed to cross the driver seat and the passenger seat that are disposed on the front seat of the vehicle. Users of the display device 100 can include a driver of the vehicle and a passenger riding in the passenger seat. Both the driver and the passenger of the vehicle can use the display device 100. For example, the driver and the passenger can both share the display device 100.

In an example embodiment, the display device 100 shown in FIG. 1 can only be partially shown. The display device 100 shown in FIG. 1 can represent a display panel among various components included in the display device 100. For example, the display device 100 shown in FIG. 1 can represent at least a portion of a display area and a non-display area of the display panel. Among the components of the display device 100, components other than those shown in FIG. 1 can be mounted inside (or in at least part of) the vehicle.

Figure 2:
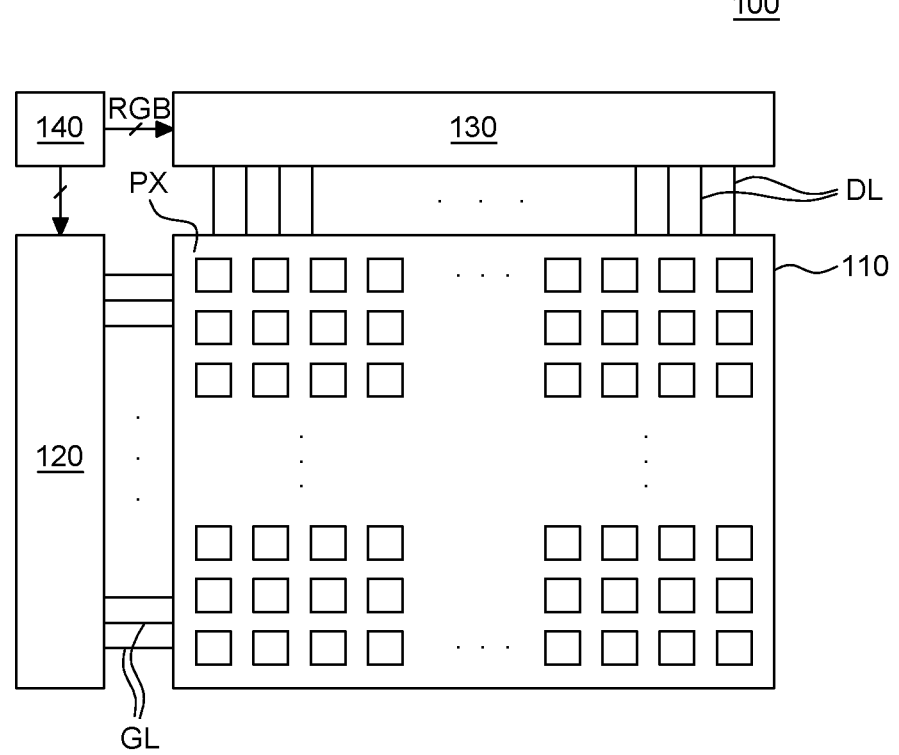
FIG. 2 is a functional block diagram of a display device according to an example embodiment of the present disclosure.

FIG. 2 is a functional block diagram of a display device according to an example embodiment of the present disclosure.

The display device according to an example embodiment of the present disclosure can be an electroluminescent display device. As the electroluminescent display device, an organic light emitting diode display device, a quantum-dot light emitting diode display device, or an inorganic light emitting diode display device can be used.

Referring to FIG. 2, the display device can include a display panel 110, a data driver 130, a gate driver 120, and a timing controller 140.

In an example embodiment, the display panel 110 can generate an image to be provided to a user. For example, the display panel 110 can generate and display an image to be provided to the user through pixel areas PX where pixel circuits are disposed.

The data driver 130, the gate driver 120, and the timing controller 140 can provide signals for operating the respective pixel areas PX through signal lines. The signal lines can include, for example, data lines DL and gate lines GL.

In some situations, the display device can further include a power unit. In this situation, signals for operating the pixel areas PX can be provided through power supply lines connecting the power unit and the display panel. According to an example embodiment, the power unit can provide power to the data driver 130 and the gate driver 120. The data driver 130 and the gate driver 120 can be driven based on power provided from the power unit.

As an example, the data driver 130 applies a data signal to each of the pixel areas PX through the data lines DL, the gate driver 120 applies a gate signal to each of the pixel areas PX through the gate lines GL, and a power unit PU can supply a power voltage to each of the pixel areas PX through power supply voltage supply lines PL.

The timing controller 140 can control the data driver 130 and the gate driver 120. For example, the timing controller 140 can rearrange digital video data input from the outside in accordance with the resolution of the display panel 110 and supply it to the data driver 130.

The data driver 130 can convert digital video data input from the timing controller 140 into an analog data voltage based on a data control signal and supply it to a plurality of the data lines.

The gate driver 120 can generate a scan signal and an emission signal (or emission control signal) based on a gate control signal. The gate driver 120 can include a scan driver and an emission signal driver. The scan driver can generate scan signals in a row-sequential manner to drive at least one scan lines connected to each pixel row and supply the scan signals to the scan lines. The emission signal driver can generate emission signals in a row sequential manner to drive at least one emission signal lines connected to each pixel row and supply the emission signals to the emission signal lines.

According to an example embodiment, the gate driver 120 can be disposed on the display panel 110 by a gate-driver in panel (GIP) method. For example, the gate driver 120 can be divided into a plurality of parts and disposed on at least two sides of the display panel 110, respectively.

The display area of the display panel 110 can include a plurality of pixel areas (or pixels, or pixel circuits) PX. In the pixel areas PX, a plurality of the data lines (e.g., the data lines DL in FIG. 3) and a plurality of the gate lines (e.g., the gate lines GL in FIG. 3) intersect, and the pixel areas PX can include sub-pixels disposed in each of these intersection areas. The respective sub-pixels included in one pixel area PX can emit light of different colors. For example, the pixel area PX can implement blue, red, and green colors using three sub-pixels. However, the present disclosure is not limited thereto, and in some situations, the pixel area PX can further include sub-pixels to further implement a specific color (e.g., white).

In the pixel area PX, an area implementing the blue color can be referred to as a blue sub-pixel area, an area implementing the red color can be referred to as a red sub-pixel area, and an area implementing the green color can be referred to as a green sub-pixel area.

In an example embodiment, the pixel area PX can include a plurality of sub-pixels. Each of the plurality of sub-pixels can be divided into a first lens area and a second lens area that provide different viewing angles. For example, the pixel area PX can include a first lens area that provides light in a first range to form a first viewing angle (e.g., a wide viewing angle for a type of view sharing mode) and a second lens area that provides light in a second range to form a second viewing angle (e.g., a narrow viewing angle for a type of privacy mode or low-distraction mode). The first range can be wider than the second range.

The non-display area can be disposed along a perimeter of the display area. Various components for driving pixel circuits disposed in the pixel area PX can be disposed in the non-display area. For example, at least a portion of the gate driver 120 can be disposed in a non-display area BZ. The non-display area BZ can be referred to as a bezel area.

Figure 3:
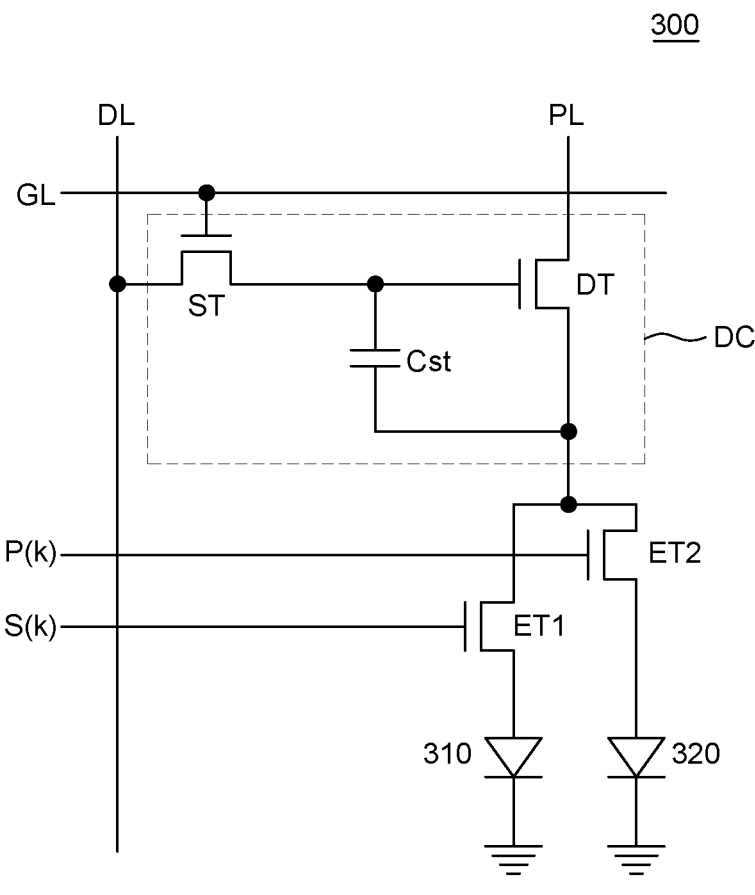
FIG. 3 shows an example of a pixel circuit of a display device according to an example embodiment of the present disclosure.

FIG. 3 shows an example of a pixel circuit of a display device according to an example embodiment of the present disclosure. The pixel area PX can include a plurality of sub-pixels that respectively display different colors, and a pixel circuit 300 corresponding to each of the plurality of sub-pixels. FIG. 3 shows an example of the pixel circuit 300 for one sub-pixel disposed in the pixel area PX.

Referring to FIG. 3, the pixel circuit 300 can include a plurality of transistors DT, ST, ET1, and ET2, a capacitor Cst, and a plurality of light emitting elements 310 and 320.

A driving transistor DT and the capacitor Cst can be connected to a switching transistor ST. A first electrode of the driving transistor DT can be connected to the power supply voltage supply line PL.

The switching transistor ST can be connected to the gate line GL and receive a gate signal. The switching transistor ST can be turned on or off by a gate signal. A first electrode of the switching transistor ST can be connected to the data line DL. In this situation, according to the turning-on of the switching transistor ST, a data signal can be supplied to a gate electrode of the driving transistor DT through the switching transistor ST.

The capacitor Cst can be disposed between a second electrode and the gate electrode of the driving transistor DT. The capacitor Cst can maintain a signal applied to the gate electrode of the driving transistor DT, e.g., a data signal, during one frame.

According to an example embodiment, the driving transistor DT, the switching transistor ST, and the capacitor Cst are components for emission driving of the light emitting elements (e.g., a first light emitting element 310 and a second light emitting element 320) and can be referred to as driving parts. However, they are not limited to these terms.

The first light emitting element 310 can be connected to a first transistor ET1 that is turned on or off by a first mode signal S(k). The second light emitting element 320 can be connected to a second transistor ET2 that is turned on or off by a second mode signal P(k).

In this situation, the first light emitting element 310 or the second light emitting element 320 can be connected to another component of the pixel circuit 300, e.g., the driving transistor DT, according to a driving mode of driving transistor DT. The driving mode can be specified by a user input or determined when pre-specified conditions are satisfied. For example, when a pre-specified first condition is satisfied, the first light emitting element 310 can emit light based on the supply of the first mode signal S(k). When a pre-specified second condition is satisfied, the second light emitting element 320 can emit light based on the supply of the second mode signal P(k). The first condition can include a pre-specified condition for driving in a first mode. The second condition can include a pre-specified condition for driving in a second mode.

Here, at least one of the first mode signal S(k) and the second mode signal P(k) can be an emission signal provided from the gate driver, but is not limited thereto and can be provided from a separate configuration. For example, it can be provided by a mode controller 1200 of FIG. 12, which will be described later.

In an example embodiment, the first mode signal S(k) can enable the pixel circuit to operate in the first mode when input as a low value. The second mode signal P(k) can enable the pixel circuit to operate in the second mode when input as a low value.

The plurality of transistors DT, ST, ET1, and ET2 of FIG. 3 can include at least one of amorphous silicon, polycrystalline silicon, and an oxide semiconductor such as IGZO. The first electrode or the second electrode of the transistor can be a source electrode or a drain electrode. For example, the first electrode can be a source electrode and the second electrode can be a drain electrode. For another example, the first electrode can be a drain electrode and the second electrode can be a source electrode.

Figure 4:
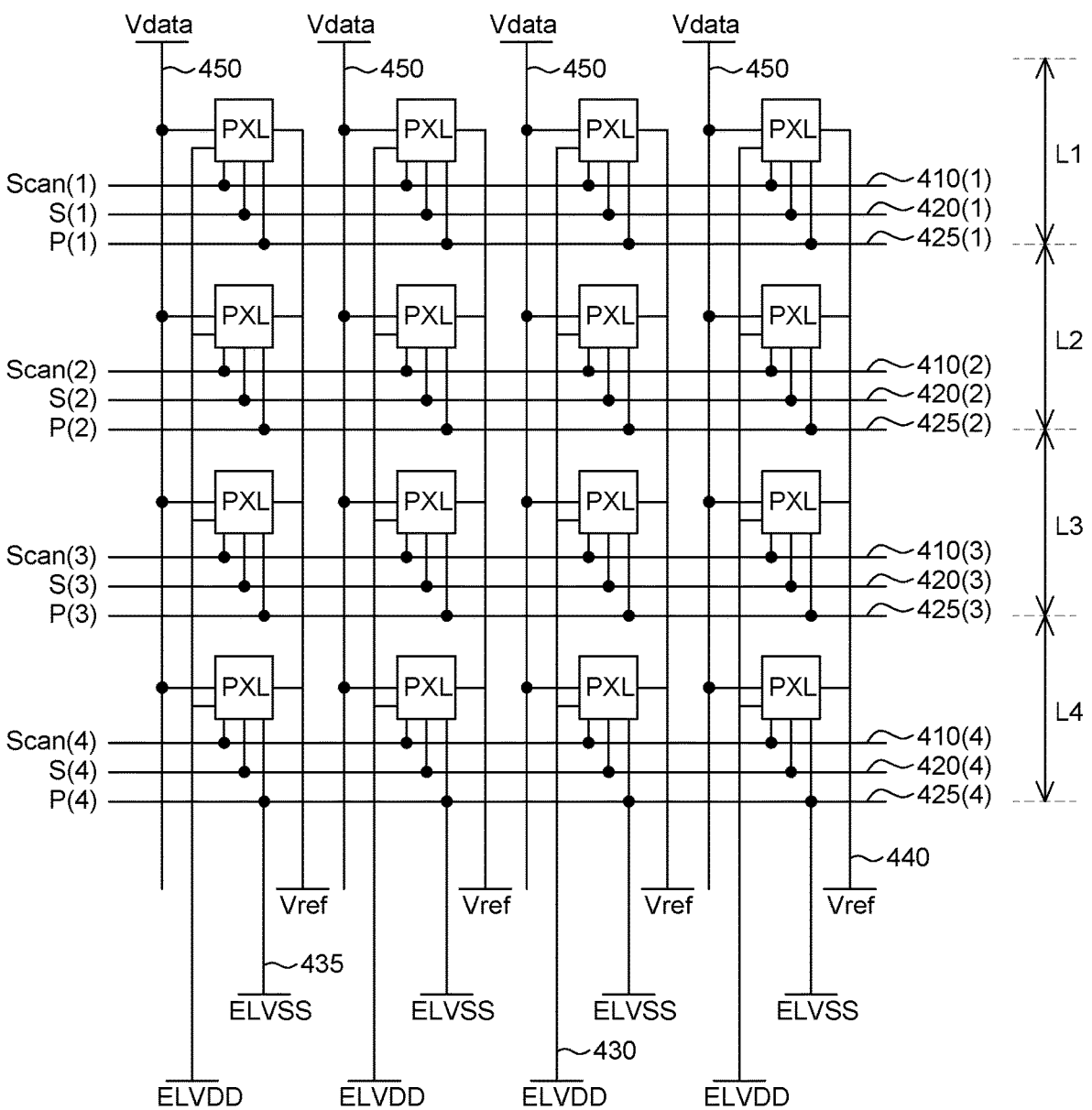
FIG. 4 shows an example of a pixel array of a display device according to an example embodiment of the present disclosure, in which a gate driver and a pixel circuit are connected.

FIG. 4 shows an example of a pixel array of a display device according to an example embodiment of the present disclosure.

Referring to FIG. 4, the pixel array of the display panel (e.g., the display panel 110 of FIG. 2) can be provided with a plurality of horizontal pixel lines L1, L2, L3, and L4. A plurality of pixels PXL that are horizontally adjacent to each other and are commonly connected to the gate lines can be disposed in each of the horizontal pixel lines L1, L2, L3, and L4. Here, the pixel area PX of FIG. 2 can include the pixel PXL. For example, the pixel area PX can be the pixel PXL.

Here, each of the horizontal pixel lines L1, L2, L3, and L4 can mean the plurality of pixels PXL disposed on one pixel line that is implemented by the pixels PXL horizontally adjacent to each other. The pixel array can include first power supply lines 430 that supply a high-potential power supply voltage ELVDD to the pixels PXL, and second power supply lines 440 that supply a reference voltage Vref to the pixels PXL. Additionally, the pixels PXL can be connected to low-potential power supply voltages ELVSS.

In an example embodiment, the gate lines can include scan lines 410 to which scan signals SCAN are supplied. In some situations, the gate lines can include first mode signal lines 420 to which a first mode signal S is supplied, and second mode signal lines 425 to which a second mode signal P is supplied, but the present disclosure is not limited thereto. The first mode signal line 420 and the second mode signal line 425 can be implemented as separate lines.

The pixel PXL can emit light of at least one color. For example, the pixel PXL can emit light of any one of red, green, blue, and white colors. The pixel PXL can constitute one unit pixel, and the color implemented in the unit pixel can be determined according to an emission ratio of red, green, blue, and white colors. To each of the pixels PXL, data lines 450, the scan lines 410, the first mode signal lines 420, and the second mode signal lines 425 can be connected.

Figure 5:
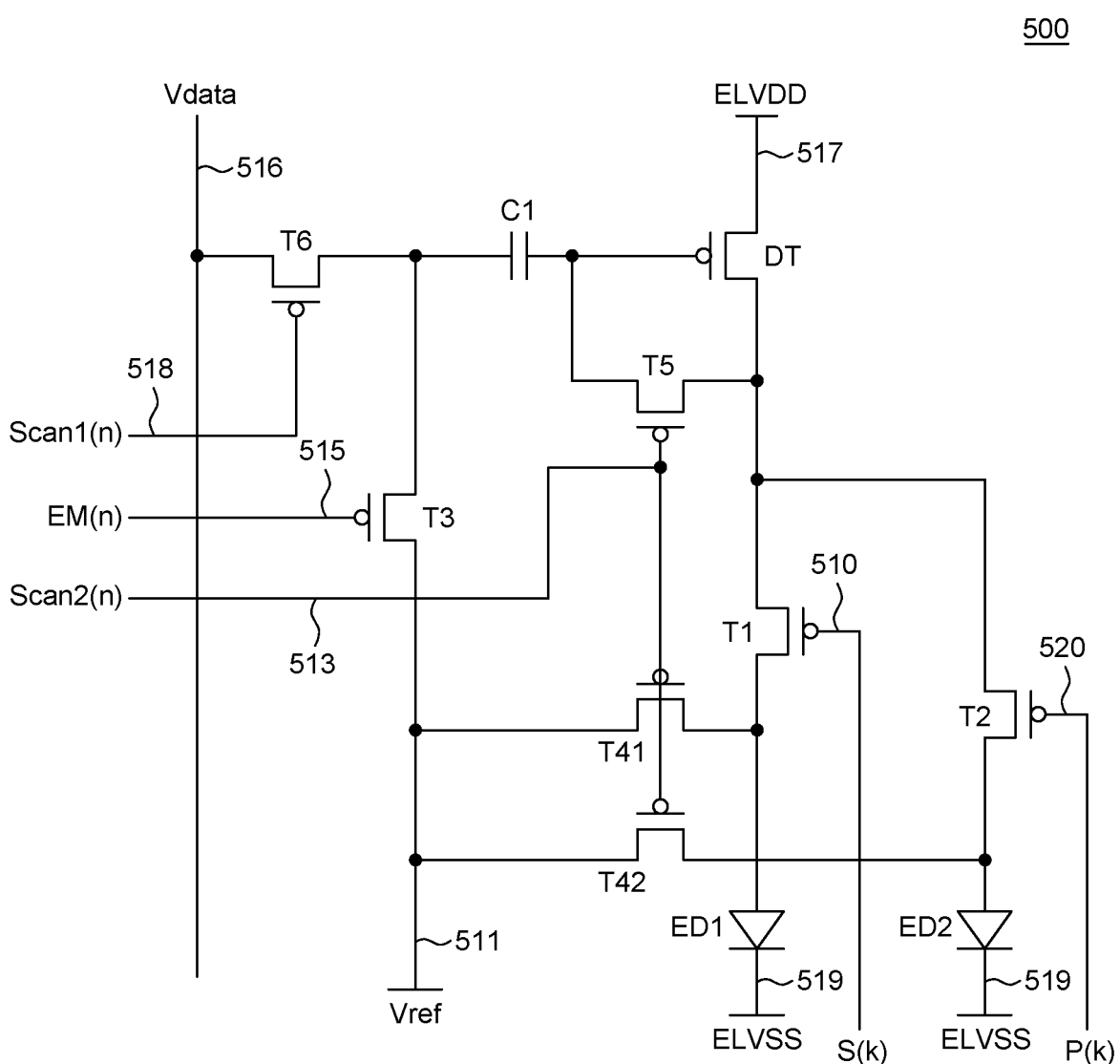
FIGS. 5 and 6 show examples of pixel circuits of a display device according to an example embodiment of the present disclosure.
Figure 6:
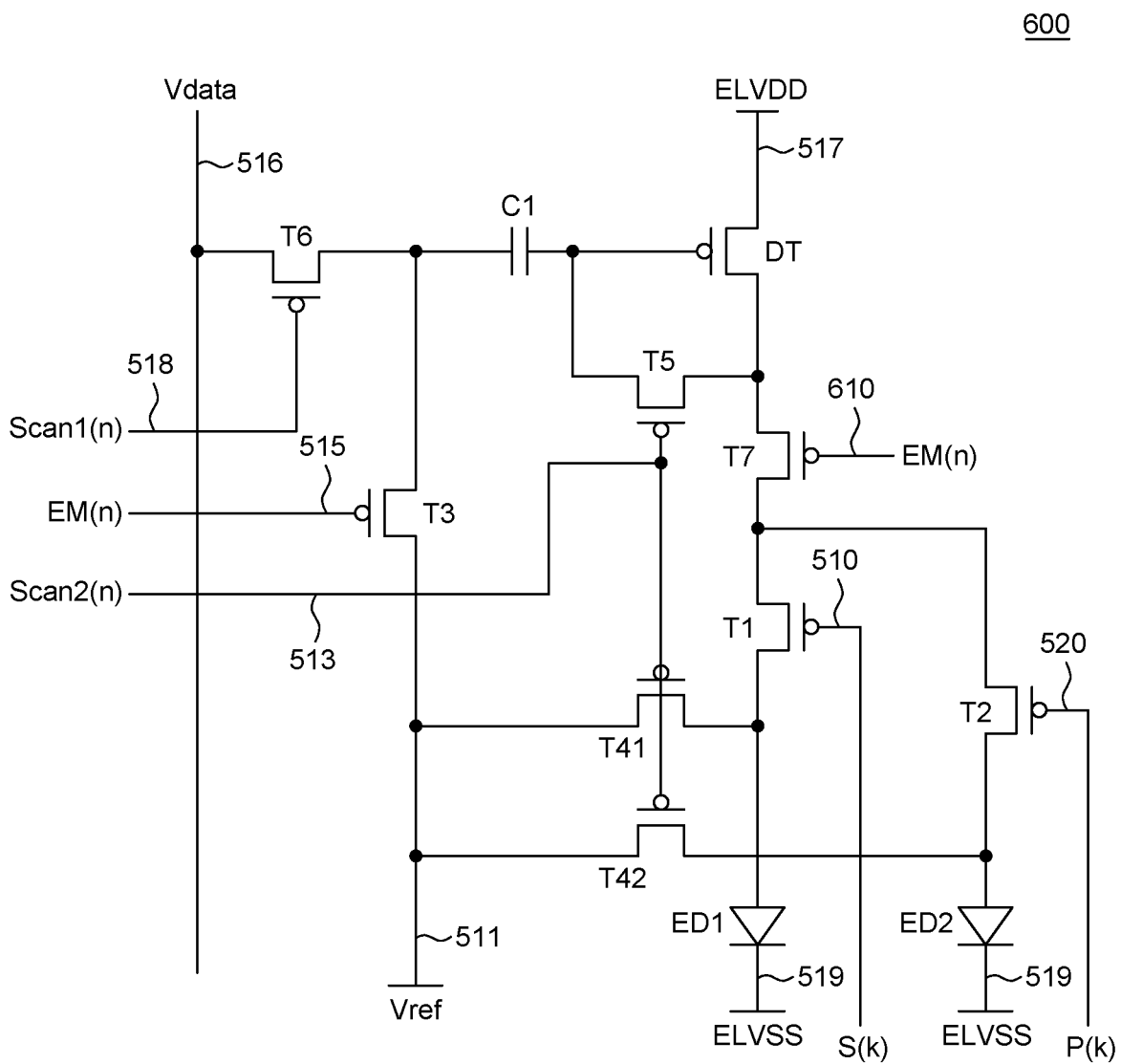

FIGS. 5 and 6 show examples of pixel circuits of a display device according to an example embodiment of the present disclosure. Specifically, FIGS. 5 and 6 show examples of pixel circuits different from that of FIG. 3.

Referring to FIG. 5, a pixel circuit 500 can include eight transistors and one capacitor. At least a part of the eight transistors included in the pixel circuit 500 can be an n-type transistor or p-type transistor. In the situation of the p-type transistor, a low-level voltage of each driving signal can refer to a voltage that turns on a thin-layer transistor (TFT) and a high-level voltage of each driving signal can refer to a voltage that turns off the TFT.

Here, the low-level voltage can correspond to a predetermined voltage that is lower than the high-level voltage. For example, the low-level voltage can include a voltage that falls within a range of −8V to −12V. The high-level voltage can correspond to a predetermined voltage that is higher than the low-level voltage. For example, the high-level voltage can include a voltage that falls within a range of 12V to 16V. According to an example embodiment, the low-level voltage can be referred to as a first voltage, and the high-level voltage can be referred to as a second voltage. In this situation, the first voltage can have a value lower than that of the second voltage.

The first electrode or the second electrode of the transistor, which will be described later, can refer to a source electrode or a drain electrode. However, the terms first electrode and second electrode are only terms for distinguishing each of the electrodes and do not limit what corresponds to each electrode. Additionally, the first electrode for each transistor may not refer to the same electrode. For example, the first electrode of a first transistor T1 can refer to a source electrode of the first transistor T1, and the first electrode of a sixth transistor T6 can refer to a drain electrode of the sixth transistor T6.

In an example embodiment, the driving transistor DT can be connected to the first transistor T1 connected to a first light emitting element ED1 and the second transistor T2 connected to a second light emitting element ED2. For example, the second electrode of the driving transistor DT can be connected to the first transistor T1 and the second transistor T2.

In an example embodiment, the driving transistor DT can be connected to a first power supply line 517 that provides a high-potential power supply voltage ELVDD. For example, the first electrode of the driving transistor DT can be connected to the first power supply line 517. When the driving transistor DT is turned on, the high-potential power supply voltage ELVDD that is supplied through the first power supply line 517 can be transferred from the first electrode to the second electrode of the driving transistor DT.

In an example embodiment, the first transistor T1 can be connected to at least one of the first light emitting element ED1, the second transistor T2, a 4-1 transistor T41, a fifth transistor T5, and the driving transistor DT.

In an example embodiment, the first electrode of the first transistor T1 can be connected to at least one of the driving transistor DT, the second transistor T2, and the fifth transistor T5. The second electrode of the first transistor T1 can be connected to at least one of the 4-1 transistor T41 and the first light emitting element ED1. A gate electrode of the first transistor T1 can be connected to a first control line 510. The first transistor T1 can be turned on or off by a first control signal S(k) which is provided through the first control line 510. When the first transistor T1 is turned on, a voltage passing through the driving transistor DT can be input to the first light emitting element ED1 (e.g., an anode electrode of the first light emitting element ED1).

Here, the first control signal S(k) can include a k-th first control signal that is supplied to the pixel circuit 500 disposed in the k-th column (k is a positive integer). The first control signal S(k) is provided by a mode controller (or mode control circuit) and can control driving (or emission) of the first light emitting element ED1 on which a first lens is disposed.

In an example embodiment, the second transistor T2 can be connected to at least one of the second light emitting element ED2, the first transistor T1, a third transistor T3, a 5-2 transistor T52, and the driving transistor DT.

In an example embodiment, the first electrode of the second transistor T2 can be connected to at least one of the driving transistor DT, the first transistor T1, and the fifth transistor T5. The second electrode of the second transistor T2 can be connected to at least one of the second light emitting element ED2 and a 4-2 transistor T42. A gate electrode of the second transistor T2 can be connected to a second control line 520. The second transistor T2 can be turned on or off by a second control signal P(k) provided through the second control line 520. When the second transistor T2 is turned on, a voltage passing through the driving transistor DT can be input to the second light emitting element ED2 (e.g., an anode electrode of the second light emitting element ED2).

In an example embodiment, each of the first light emitting element ED1 and the second light emitting element ED2 can include a light emitting diode. For example, each of the first light emitting element ED1 and the second light emitting element ED2 can be formed of an organic light emitting diode.

Here, the second control signal P(k) can include a k-th second control signal that is supplied to the pixel circuit 500 disposed in the k-th column. The second control signal P(k) is provided by the mode controller and can control driving (or emission) of the second light emitting element ED2 on which a second lens is disposed.

In an example embodiment, the first lens can be disposed on the first light emitting element ED1. A viewing angle of an area where the first light emitting element ED1 is disposed can correspond to a first value by the first lens. For example, the viewing angle of the area where the first light emitting element ED1 is disposed can be equal to or greater than the first value. The second lens can be disposed on the second light emitting element ED2. A viewing angle of an area where the second light emitting element ED2 is disposed can correspond to a second value by the second lens. The second value can be smaller than the first value. For example, the viewing angle of the area where the second light emitting element ED2 is disposed can be equal to or less than the second value.

In an example embodiment, assuming that the pixel circuit 500 is disposed adjacent to the passenger seat, an area of the pixel circuit 500 where the first light emitting element ED1 is disposed can have a viewing angle of the first value to provide light in the range from the passenger seat to the driver seat next to the passenger seat (e.g., for a sharing viewing mode with a wide viewing angle). The area where the second light emitting element ED2 is disposed can have a viewing angle of the second value to provide light in the range corresponding to the passenger seat (e.g., for a privacy viewing mode or a low distraction viewing mode with a narrow viewing angle).

In an example embodiment, the third transistor T3 can be connected to at least one of the 4-1 transistor T41, the 4-2 transistor T42, the sixth transistor T6, and a capacitor C1. For example, a first electrode of the third transistor T3 can be connected to the sixth transistor T6 and the capacitor C1. A second electrode of the third transistor T3 can be connected to the 4-1 transistor T41 and the 4-2 transistor T42. A gate electrode of the third transistor T3 can be connected to an emission signal line 515 that supplies an emission signal EM(n). The emission signal EM(n) can correspond to an n-th emission signal EM(n) that is supplied to the pixel circuit 500 disposed in an n-th pixel row (where n is a positive integer). The third transistor T3 can be turned on or off by the emission signal EM(n). The second electrode of the third transistor T3 can be connected to a reference voltage line 511 that supplies the reference voltage Vref, e.g., the second power supply line 440 of FIG. 4.

In an example embodiment, the 4-1 transistor T41 can be connected to at least one of the first transistor T1, the third transistor T3, and the first light emitting element ED1. For example, a first electrode of the 4-1 transistor T41 can be connected to the third transistor T3. A second electrode of the 4-1 transistor T41 can be connected to the first transistor T1 and the first light emitting element ED1. A gate electrode of the 4-1 transistor T41 can be connected to an n-th second scan line 513. Accordingly, the 4-1 transistor T41 can be supplied with an n-th second scan signal Scan2($n$) and be turned on or off by the n-th second scan signal Scan2($n$). In an example embodiment, the 4-2 transistor T42 can be connected to at least one of the second transistor T2, the third transistor T3, and the second light emitting element ED2. For example, a first electrode of the 4-2 transistor T42 can be connected to the third transistor T3. A second electrode of the 4-2 transistor T42 can be connected to the second transistor T2 and the second light emitting element ED2. A gate electrode of the 4-2 transistor T42 can be connected to the n-th second scan line 513. Accordingly, the 4-2 transistor T42 can be supplied with the n-th second scan signal Scan2($n$) and be turned on or off by the n-th second scan signal Scan2($n$).

In an example embodiment, the fifth transistor T5 can be connected to at least one of the driving transistor DT, the 4-1 transistor T41, the 4-2 transistor T42, the capacitor C1, the first transistor T1, and the second transistor T2. For example, a first electrode of the fourth transistor T4 can be connected to the driving transistor DT and the capacitor C1. A second electrode of the fifth transistor T5 can be connected to the driving transistor DT, the first transistor T1, and the second transistor T2. A gate electrode of the fifth transistor T5 can be connected to the n-th second scan line 513 that supplies the second scan signal Scan2($n$) in the n-th row. The fifth transistor T5 can be supplied with the n-th second scan signal Scan2($n$) and be turned on or off by the n-th second scan signal Scan2($n$).

According to an example embodiment, an n-th first scan line 518 can provide an n-th first scan signal. In this situation, the n-th first scan signal can be provided to a gate electrode of the sixth transistor T6. The n-th second scan line 513 can provide the n-th second scan signal. In this situation, the n-th second scan signal can be provided to the gate electrode of each of the 4-1 transistor T41, the 4-2 transistor T42, and the fifth transistor T5.

In an example embodiment, the sixth transistor T6 can be connected to at least one of the third transistor T3 and the capacitor C1. For example, a first electrode of the sixth transistor T6 can be connected to the third transistor T3 and the capacitor C1. A second electrode of the sixth transistor T6 can be connected to a data line 516 that supplies a data voltage Vdata. A gate electrode of the sixth transistor T6 can be connected to the n-th first scan line 518 that supplies an n-th first scan signal Scan1($n$). The sixth transistor T6 can be supplied with the n-th first scan signal Scan1($n$) and be turned on or off by the n-th first scan signal Scan1($n$). When the sixth transistor T6 is turned on, the data voltage Vdata can be transferred from the second electrode to the first electrode of the sixth transistor T6.

In an example embodiment, the first light emitting element ED1 and/or the second light emitting element ED2 can be connected to a third power supply line 519 that supplies a low-potential power supply voltage ELVSS, e.g., to a third power supply line 435 of FIG. 4. For example, a cathode electrode of the first light emitting element ED1 and a cathode electrode of the second light emitting element ED2 can be connected to the third power supply line 519 and receive the low-potential power supply voltage ELVSS.

According to an example embodiment, the low-potential power supply voltage can include ground (or ground voltage, 0V (volt)). For example, the cathode electrode of the first light emitting element ED1 and the cathode electrode of the second light emitting element ED2 can be supplied with a voltage corresponding to the ground.

FIG. 6 shows a pixel circuit 600 according to another example embodiment different from that of FIG. 5. Hereinafter, content that overlaps with the content described in FIG. 5 can be omitted. The pixel circuit 600 of FIG. 6 can include nine transistors and one capacitor. At least a portion of the nine transistors included in the pixel circuit 600 can be implemented as an n-type transistor or p-type transistor.

Referring to FIG. 6, the pixel circuit 600 can include a seventh transistor T7. The seventh transistor T7 can be connected to at least one of the first transistor T1, the second transistor T2, the fifth transistor T5, and the driving transistor DT. For example, a first electrode of the seventh transistor T7 can be connected to at least one of the fifth transistor T5 and the driving transistor DT. A second electrode of the seventh transistor T7 can be connected to at least one of the first transistor T1 and the second transistor T2.

In an example embodiment, a gate electrode of the seventh transistor T7 can be connected to an emission signal line 610 that provides the emission signal EM(n). The seventh transistor T7 can be turned on or off based on the emission signal EM(n). When the seventh transistor T7 is turned on, a voltage (or current) can be provided from the first electrode to the second electrode of the seventh transistor T7.

Figure 7:
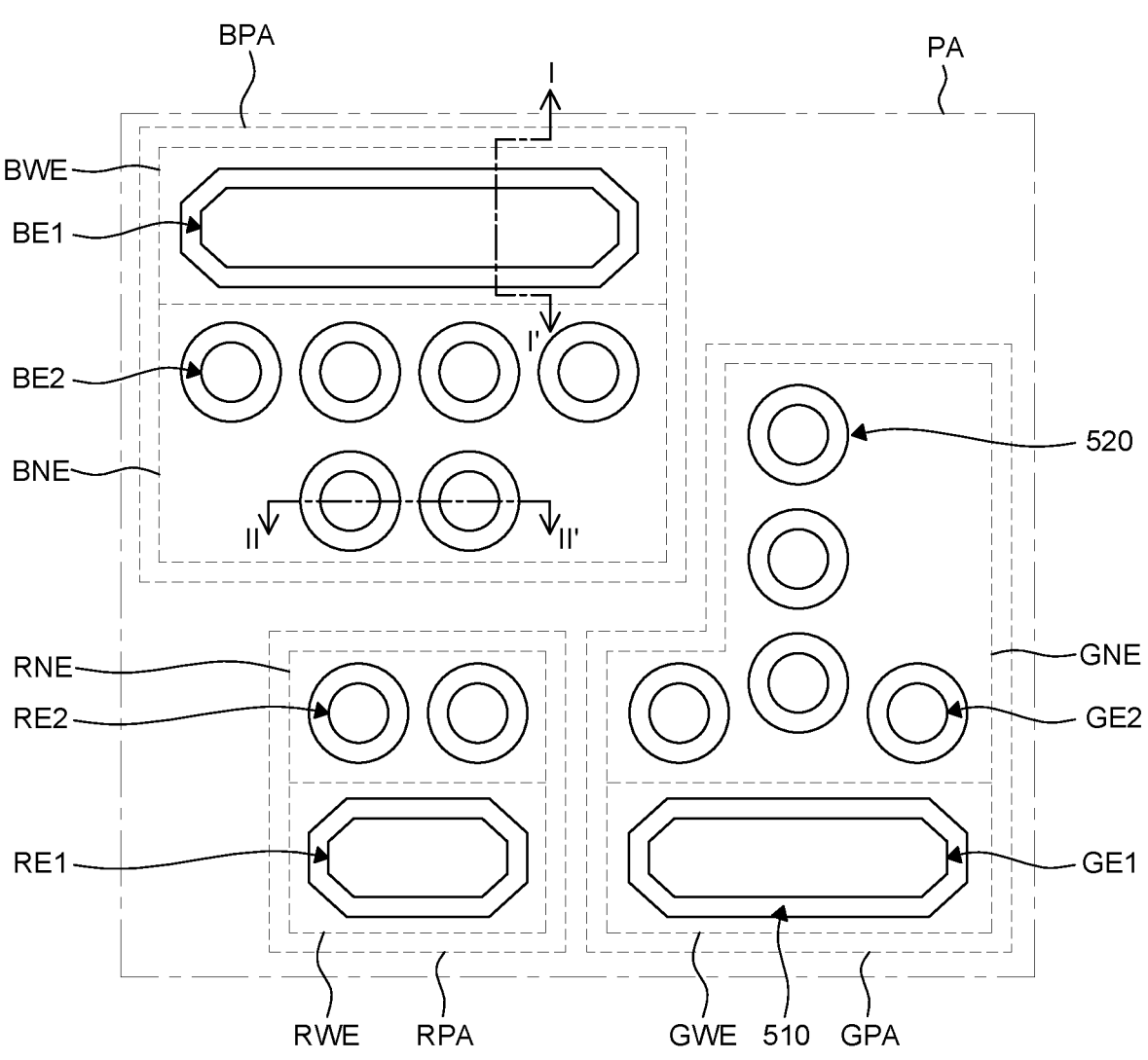
FIG. 7 shows an example of a lens arrangement included in a display device according to an example embodiment of the present disclosure.
Figure 8:
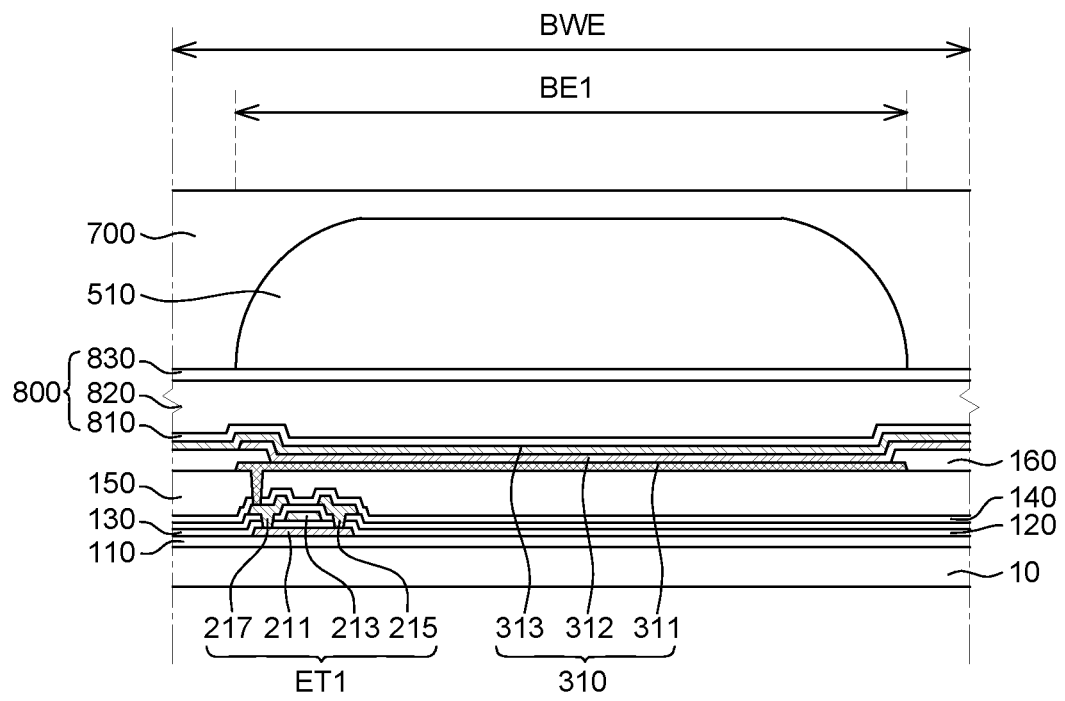
FIG. 8 shows an example of cross-section I-I' of FIG. 7 according to an example embodiment of the present disclosure.
Figure 9:
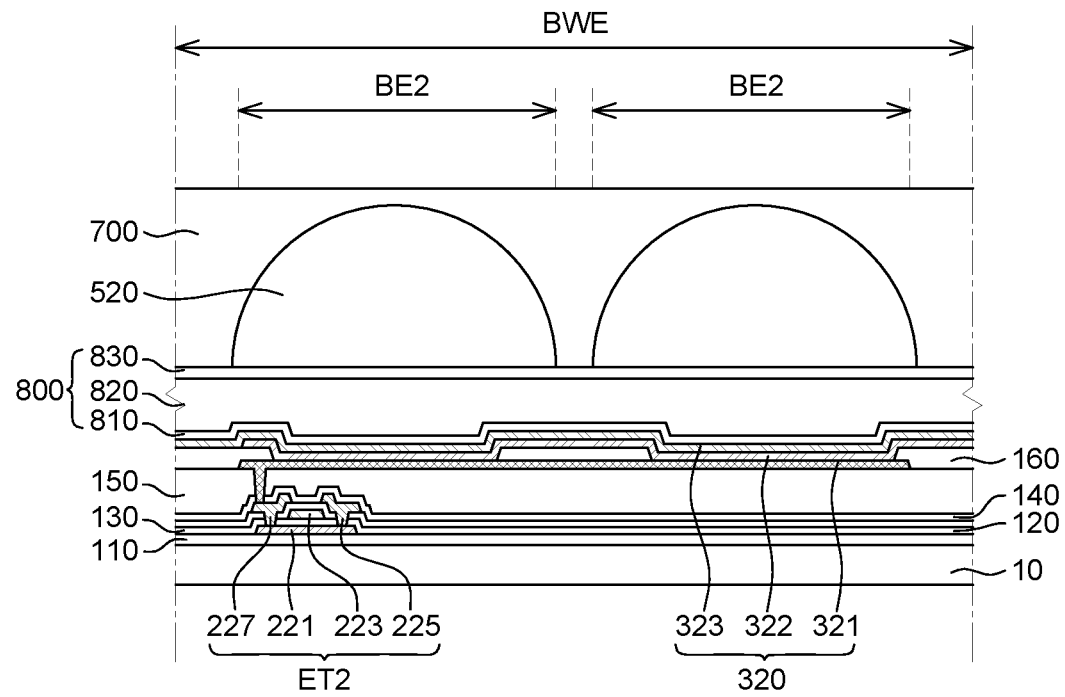
FIG. 9 shows an example of cross-section II-II' of FIG. 7 according to an example embodiment of the present disclosure.

FIG. 7 shows a plan view of a portion of a display device according to an example embodiment of the present disclosure. FIG. 7 shows a plane view of a pixel area PA when three sub-pixels are disposed in the pixel area PA. FIG. 8 shows a cross-section taken along line I-I' of FIG. 7 according to an embodiment of the present disclosure, and FIG. 9 shows a cross-section taken along line II-II' of FIG. 7 according to an embodiment of the present disclosure. Hereinafter, FIGS. 7 to 9 are referred together.

In FIG. 7, the pixel area PA can include a blue sub-pixel area BPA implementing blue color, a red sub-pixel area RPA implementing red color, and a green sub-pixel area GPA implementing green color. According to an example embodiment, the blue sub-pixel area BPA can correspond to a first sub-pixel, the red sub-pixel area RPA can correspond to a second sub-pixel, and the green sub-pixel area GPA can correspond to a third sub-pixel. The pixel circuit can correspond to each sub-pixel. A corresponding pixel circuit can be disposed for each sub-pixel.

The pixel area PA can include first lens areas BWE, RWE, and GWE and second lens areas BNE, RNE, and GNE that provide different viewing angles (e.g., a wide viewing angle mode and a narrow viewing angle mode). The second lens areas BNE, RNE, and GNE of each pixel area PA can operate independently from the first lens areas BWE, RWE, and GWE of the corresponding pixel area PA. For example, each pixel area PA can include the first light emitting element 310 (e.g., first light emitting element 310 in FIG. 3) located on the first lens areas BWE, REW, and GWE of the corresponding pixel area PA and the second light emitting element 320 (e.g., the second light emitting element 320 in FIG. 3) located on the second lens areas BNE, RNE, and GNE of the corresponding pixel area PA.

Also, according to another embodiment, a third mode can be provided in which the first mode (e.g., wide viewing angle mode) and the second mode (e.g., narrow viewing angle mode) can be simultaneously activated at the same time. For example, the third mode can be referred to as a high brightness mode which can be useful during situations when the ambient light is very bright, such as during a bright sunny day etc., but embodiments are not limited thereto.

The first light emitting element 310 can emit light of a specific color. For example, the first light emitting element 310 can include a first lower electrode 311, a first light emitting layer 312, and a first upper electrode 313 that are sequentially stacked on a substrate 10. The substrate 10 can include an insulating material. The substrate 10 can include a transparent material. For example, the substrate 10 can include glass or plastic.

The first lower electrode 311 can include a conductive material. The first lower electrode 311 can include a material with high reflectivity. For example, the first lower electrode 311 can include metal such as aluminum (Al) and silver (Ag). The first lower electrode 311 can have a multilayer structure. For example, the first lower electrode 311 can have a structure in which a reflective electrode formed of metal is located between transparent electrodes formed of transparent conductive materials such as ITO and IZO.

The first light emitting layer 312 can generate light with a luminance corresponding to a difference in voltage between the first lower electrode 311 and the first upper electrode 313. For example, the first light emitting layer 312 can include an emission material layer EML including an emission material. The emission material can include an organic material, an inorganic material, or a hybrid material of an organic material and an inorganic material.

The first light emitting layer 312 can have a multilayer structure. For example, the first light emitting layer 312 can further include at least one of a hole injection layer HIL, a hole transport layer HTL, an electron transport layer ETL, and an electron injection layer EIL.

The first upper electrode 313 can include a conductive material. The first upper electrode 313 can include a material different from that of the first lower electrode 311. Transmittance of the first upper electrode 313 can be higher than transmittance of the first lower electrode 311. For example, the first upper electrode 313 can be a transparent electrode formed of a transparent conductive material such as ITO and IZO. Accordingly, in the display device according to an example embodiment of the present disclosure, light generated by the first light emitting layer 312 can be emitted through the first upper electrode 313.

The second light emitting element 320 can implement the same color as the first light emitting element 310. The second light emitting element 320 can have the same structure as the first light emitting element 310. For example, the second light emitting element 320 can include a second lower electrode 321, a second light emitting layer 322, and a second upper electrode 323 that are sequentially stacked on the substrate 10.

The second lower electrode 321 can correspond to the first lower electrode 311, the second light emitting layer 322 can correspond to the first light emitting layer 312, and the second upper electrode 323 can correspond to the first upper electrode 313. For example, the second lower electrode 321 can be formed in the second light emitting element 320 while having the same structure as the first lower electrode 311, which is applied to the second light emitting layer 322 and the second upper electrode 323 in the same manner. For example, the first light emitting element 310 and the second light emitting element 320 can be formed to have the same structure. However, the present disclosure is not limited thereto, and in some situations, at least some components of the first light emitting element 310 and the second light emitting element 320 can be formed differently. For example, the first light emitting element 310 and the second light emitting element 320 can be different sizes from each other and different shapes from each other, but embodiments are not limited thereto.

In an example embodiment, the second light emitting layer 322 can be spaced apart from the first light emitting layer 312. Accordingly, in the display device according to an example embodiment of the present disclosure, emission due to leakage current can be prevented.

According to an example embodiment of the present disclosure, in the display device, light can be generated from only one of the first light emitting layer 312 and the second light emitting layer 322 according to a user's selection or predetermined conditions.

In an example embodiment, the first light emitting element 310 and the second light emitting element 320 of the pixel area PA can be located on a driving part of the pixel area PA. For example, at least one insulating layer (e.g., a device buffer layer 110, a gate insulating layer 120, an interlayer insulating layer 130, a lower protective layer 140, and an overcoat layer 150) can be located on the substrate 10, and the first light emitting element 310 and the second light emitting element 320 of each pixel area PA can be disposed on one of the insulating films. Accordingly, in the display device according to an example embodiment of the present disclosure, it is possible to prevent the first light emitting element 310 and the second light emitting element 320 of each pixel area PA from being unnecessarily connected to the driving part 205 of the corresponding pixel area PA.

In an example embodiment, the buffer layer 110, the gate insulating layer 120, the interlayer insulating layer 130, the lower protective layer 140, and the overcoat layer 150 can be stacked on the substrate 10. The buffer layer 110 can include an insulating material. For example, the buffer layer 110 can include an inorganic insulating material such as silicon oxide (SiOx) and silicon nitride (SiNx). The buffer layer 110 can have a multilayer structure. For example, the buffer layer 110 can have a stacked structure of a layer formed of silicon nitride (SiNx) and a layer formed of silicon oxide (SiOx).

In an example embodiment, the buffer layer 110 can be located between the device substrate 10 and the driving part 205 of each pixel area PA. The buffer layer 110 can prevent contamination due to the substrate 10 during a formation process of the driving part 205. For example, an upper surface of the substrate 10 facing the driving part 205 of each pixel area PA can be covered with the buffer layer 110. The driving part 205 of each pixel area PA can be located on the buffer layer 110.

In an example embodiment, the gate insulating layer 120 can include an insulating material. For example, the gate insulating layer 120 can include an inorganic insulating material such as silicon oxide (SiOx) and silicon nitride (SiNx). The gate insulating layer 120 can include a material with a high dielectric constant. For example, the gate insulating layer 120 can include a high-K material such as hafnium oxide (HfO). The gate insulating layer 120 can have a multilayer structure.

The gate insulating layer 120 can be located on the buffer layer 110. The gate insulating layer 120 can extend between a semiconductor layer and a gate electrode of a transistor. For example, the gate electrodes of the driving transistor DT and the switching transistor ST can be insulated from semiconductor layers of the driving transistor DT and the switching transistor ST by the gate insulating layer 120. The gate insulating layer 120 can cover a first semiconductor layer and a second semiconductor layer of each pixel area PA. The gate electrodes of the driving transistor DT and the switching transistor ST can be located on the gate insulating layer 120.

The interlayer insulating layer 130 can include an insulating material. For example, the interlayer insulating layer 130 can include an inorganic insulating material such as silicon oxide (SiOx) and silicon nitride (SiNx). The interlayer insulating layer 130 can be located on the gate insulating layer 120. The interlayer insulating layer 130 can extend between the gate electrode and the source electrode and between the gate electrode and the drain electrode of each of the driving transistor DT and the switching transistor ST. For example, the source electrode and the drain electrode of each of the driving transistor DT and the switching transistor ST can be insulated from the gate electrode by the interlayer insulating layer 130. The interlayer insulating layer 130 can cover the gate electrode of each of the driving transistor DT and the switching transistor ST. The source electrode and the drain electrode of each pixel area PA can be located on the interlayer insulating layer 130. The gate insulating layer 120 and the interlayer insulating layer 130 can expose a source region and a drain region of each semiconductor pattern located in each pixel area PA.

In an example embodiment, the lower protective layer 140 can include an insulating material. For example, the lower protective layer 140 can include an inorganic insulating material such as silicon oxide (SiOx) and silicon nitride (SiNx). The lower protective layer 140 can be located on the interlayer insulating layer 130. The lower protective layer 140 can prevent damage to the driving part 205 due to external moisture and impacts. The lower protective layer 140 can extend along surfaces of the driving transistor DT and the switching transistor ST facing the substrate 10. The lower protective layer 140 can contact the interlayer insulating layer 130 at an outside of the driving part 205 located within each pixel area PA.

The overcoat layer 150 can include an insulating material. The overcoat layer 150 can include a material different from that of the lower protective layer 140. For example, the overcoat layer 150 can include an organic insulating material. The overcoat layer 150 can be located on the lower protective layer 140. The overcoat layer 150 can remove a step caused by the driving part 205 in each pixel area PA. For example, an upper surface of the overcoat layer 150 facing the device substrate 10 can be a flat surface. For example, the overcoat layer 150 can provide a planarization function.

In an example embodiment, the first transistor ET1 can be electrically connected between the drain electrode of the driving transistor DT and the first lower electrode 311 of the first light emitting element 310. The second transistor ET2 can be electrically connected between the drain electrode of the driving transistor DT and the second lower electrode 321 of the second light emitting element 320.

The first transistor ET1 can include a first semiconductor layer 211, a first gate electrode 213, a first source electrode 215, and a first drain electrode 217. The first transistor T1 can have the same structure as the switching transistor ST and the driving transistor DT. For example, the first semiconductor layer 211 can be located between the buffer layer 110 and the gate insulating layer 120, and the first gate electrode 213 can be located between the gate insulating layer 120 and the interlayer insulating layer 130. The first source electrode 215 and the first drain electrode 217 can be located between the interlayer insulating layer 130 and the lower protective layer 140. The first gate electrode 213 can overlap a channel region of the first semiconductor layer 211. The first source electrode 215 can be electrically connected to a source region of the first semiconductor layer 211. The first drain electrode 217 can be electrically connected to a drain region of the first semiconductor layer 211.

In an example embodiment, the second transistor ET2 can include a second semiconductor layer 221, a second gate electrode 223, a second source electrode 225, and a second drain electrode 227. For example, the second semiconductor layer 221 can be located on the same layer as the first semiconductor layer 211, the second gate electrode 223 can be located on the same layer as the first gate electrode 213, and the second source electrode 225 and the second drain electrode 227 can be located on the same layer as the first source electrode 215 and the first drain electrode 217.

In an example embodiment, the first transistor ET1 can be formed simultaneously with the switching transistor ST and the driving transistor DT. The first transistor ET1 can be formed simultaneously with the second transistor ET2.

The first light emitting element 310 and the second light emitting element 320 of each pixel area PA can be located on the overcoat layer 150 of the corresponding pixel area PA. For example, the first lower electrode 311 of the first light emitting element 310 can be electrically connected to the first drain electrode 217 (or the first source electrode 215) of the first transistor ET1 through contact holes penetrating the lower protective layer 140 and the overcoat layer 150. The second lower electrode 321 of the second light emitting element 320 can be electrically connected to the second drain electrode 227 (or the second source electrode 225) of the second transistor ET2 through contact holes penetrating the lower protective layer 140 and the overcoat layer 150.

The second lower electrode 321 of each pixel area PA can be spaced apart from the first lower electrode 311 of the corresponding pixel area PA. For example, a bank insulating layer 160 can be located between the first lower electrode 311 and the second lower electrode 321 of each pixel area PA. The bank insulating layer 160 can include an insulating material. For example, the bank insulating layer 160 can include an organic insulating material. The bank insulating layer 160 can include a material different from that of the overcoat layer 150. However, according to another embodiment, the bank insulating layer 160 and the overcoat layer 150 can include a same material.

The second lower electrode 321 of each pixel area PA can be insulated from the first lower electrode 311 of the corresponding pixel area PA by the bank insulating layer 160. For example, the bank insulating layer 160 can cover an edge of the first lower electrode 311 and an edge of the second lower electrode 321 that are located within the respective pixel areas PA. Accordingly, in the display device, images through the first lens areas BWE, RWE, and GWE of each pixel area PA where the first light emitting element 310 is located or images through the second lens areas BNE, RNE, and GNE of each pixel area PA where the second light emitting element 320 is located can be provided to a user.

The first light emitting layer 312 and the first upper electrode 313 of the first light emitting element 310 that is located in each pixel area PA can be stacked on a portion of the first lower electrode 311 exposed by the bank insulating layer 160. The second light emitting layer 322 and the second upper electrode 323 of the second light emitting element 320 that is located in each pixel area PA can be stacked on a portion of the second lower electrode 321 exposed by the bank insulating layer 160. For example, the bank insulating layer 160 can divide first emission areas BE1, RE1, and GE1 where light is emitted by the first light emitting element 310 and second emission areas BE2, RE2, and GE2 where light is emitted by the second light emitting element 320 in each pixel area PA. Sizes of the second emission areas BE2, RE2, and GE2 that are divided within each pixel area PA can be smaller than those of the first emission areas BE1, RE1, and GE1.

The second upper electrode 323 of each pixel area PA can be electrically connected to the first upper electrode 313 of the corresponding pixel area PA. For example, a voltage applied to the second upper electrode 323 of the second light emitting element 320 located within each pixel area PA can be equal to a voltage applied to the first upper electrode 313 of the first light emitting element 310 located within the corresponding pixel area PA. The second upper electrode 323 of each pixel area PA can include the same material as the first upper electrode 313 of the corresponding pixel area PA. For example, the second upper electrode 323 of each pixel area PA can be formed simultaneously with the first upper electrode 313 of the corresponding pixel area PA. The second upper electrode 323 of each pixel area PA can extend onto the bank insulating layer 160 and directly contact the first upper electrode 313 of the corresponding pixel area PA. Luminance of the first lens areas BWE, RWE, and GWE and luminance of the second lens areas BNE, RNE, and GNE that are located within each pixel area PA can be controlled by a driving current generated in the corresponding pixel area PA.

An encapsulation member 800 can be located on the first light emitting element 310 and the second light emitting element 320 of each pixel area PA. The encapsulation member 800 can prevent damage to the light emitting elements 310 and 320 due to external moisture and impacts. The encapsulation member 800 can have a multilayer structure. For example, the encapsulation member 800 can include a first encapsulation layer 810, a second encapsulation layer 820, and a third encapsulation layer 830, which are sequentially stacked, and embodiments of the present disclosure are not limited thereto. The first encapsulation layer 810, the second encapsulation layer 820, and the third encapsulation layer 830 can include an insulating material. The second encapsulation layer 820 can include a material different from those of the first encapsulation layer 810 and the third encapsulation layer 830. For example, the first encapsulation layer 810 and the third encapsulation layer 830 can be inorganic encapsulation layers including an inorganic insulating material, and the second encapsulation layer 820 can include an organic encapsulation layer including an organic insulating material. Accordingly, the light emitting elements 310 and 320 of the display device can be more effectively prevented from being damaged by moisture and impacts from the outside.

First lenses 510 and second lenses 520 can be located on the encapsulation member 800 of each pixel area PA.

The first lenses 510 can be located on the first lens areas BWE, RWE, and GWE of each pixel area PA. For example, light generated by the first light emitting element 310 of each pixel area PA can be emitted through the first lens 510 of the corresponding pixel area PA. The first lens 510 can have a shape such that light in at least one direction is not limited. For example, a planar shape of the first lens 510 located within each pixel area PA can have a bar shape extending in a first direction. Also, according to an embodiment the first lens 510 located within each pixel area PA can have a semi-cylindrical shape, but embodiments are not limited thereto.

In this situation, a traveling direction of light emitted from the first lens areas BWE, RWE, and GWE of the pixel area PA may not be limited to the first direction. For example, content (or images) provided through the first lens areas BWE, RWE, and GWE of the pixel area PA can be shared by a user and people around the user who are adjacent to the user in the first direction. A situation of a device configured to provide content through the first lens areas BWE, RWE, and GWE, can be referred to as a first mode, which is a mode that provides content in a first viewing angle range wider than a second viewing angle range provided by the second lens areas BNE, RNE, and GNE. For example, the first lens areas BWE, RWE, and GWE of the pixel area PA can be used to provide a wide viewing angle for a first mode (e.g., a sharing mode).

The second lenses 520 can be located on the second lens areas BNE, RNE, and GNE of each pixel area PA. Light generated by the second light emitting element 320 of the pixel area PA can be emitted through the second lens 520 in the pixel area PA. The second lens 520 can limit a traveling direction of light passing therethrough to the first direction and/or a second direction. For example, a planar shape of the second lens 520 located in the pixel area PA can have a circular shape. In this situation, a traveling direction of light emitted from the second lens areas BNE, RNE, and GNE of the pixel area PA can be limited to the first direction and the second direction. For example, content provided by the second lens areas BNE, RNE, and GNE of the pixel area PA may not be shared with people around the user. A situation of a device configured to provide content through the second lens areas BNE, RNE, and GNE, can be referred to as a second mode, which is a mode that provides content in the second viewing angle range narrower than the first viewing angle range provided by the first lens areas BWE, RWE, and GWE. For example, the second lens areas BNE, RNE, and GNE of the pixel area PA can be used to provide a narrow viewing angle for a second mode (e.g., a private viewing mode, a privacy mode, or a low distraction viewing mode, etc.).

The first emission areas BE1, RE1, and GE1 included in the first lens areas BWE, RWE, and GWE of each pixel area PA can have shapes corresponding to the first lenses 510 located on the first lens areas BWE, RWE, and GWE of the corresponding pixel area PA. For example, planar shapes of the first emission areas BE1, RE1, and GE1 that are defined within the first lens areas BWE, RWE, and GWE of each pixel area PA can have bar shapes extending in the first direction. The first lenses 510 that are located on the first lens areas BWE, RWE, and GWE of the pixel area PA can have sizes greater than those of the first emission areas BE1, RE1, and GE1 included in the first lens areas BWE, RWE, and GWE of the pixel area PA. Accordingly, efficiency of light emitted from the first emission areas BE1, RE1, and GE1 of the pixel area PA can be improved.

The second emission areas BE2, RE2, and GE2 included in the second lens areas BNE, RNE, and GNE of each pixel area PA can have shapes corresponding to the second lenses 520 that are located on the second lens areas BNE, RNE, and GNE of the corresponding pixel area PA. For example, planar shapes of the second emission areas BE2, RE2, and GE2 included in the second lens areas BNE, RNE, and GNE of the pixel area PA can have circular shapes. Also, the second lens areas BNE, RNE, and GNE of the pixel area PA can have hemi-spherical shapes, but embodiments are not limited thereto. The second lenses 520 located on the second lens areas BNE, RNE, and GNE of the pixel area PA can have sizes greater than those of the second emission areas BE2, RE2, and GE2 included in the second lens areas BNE, RNE, and GNE of the corresponding pixel area PA. For example, planar shapes of the second emission areas BE2, RE2, and GE2 that are located within the second lens areas BNE, RNE, and GNE of each pixel area PA can be concentric with planar shapes of the second lenses 520 located on the second lens areas BNE, RNE, and GNE of the corresponding pixel area PA. In this situation, efficiency of light emitted from the second emission areas BE2, RE2, and GE2 of the pixel area PA can be improved.

In an example embodiment, the first lens areas BWE, RWE, and GWE of the pixel area PA can include corresponding single first emission areas BE1, RE1, and GE1, respectively. The second lens areas BNE, RNE, and GNE of the pixel area PA can include a plurality of second emission areas BE2, RE2, and GE2.

In an example embodiment, one first lens 510 can be disposed on the first lens areas BWE, RWE, and GWE of the pixel area PA. A plurality of second lenses 520 can be disposed on the second lens areas BNE, RNE, and GNE of the pixel area PA.

In an example embodiment, the second emission areas BE2, RE2, and GE2 included in the second lens areas BNE, RNE, and GNE of the pixel area PA can be driven for each sub-pixel area. The second emission areas (e.g., the second emission areas BE2, RE2, and GE2) included in one sub-pixel area can be driven simultaneously, but embodiments are not limited thereto. For example, according to another embodiment, the second emission areas for each color (e.g., BE2, RE2, and GE2) can be selectively activated to provide different brightness levels for the private viewing mode, but embodiments are not limited thereto.

In an example embodiment, one second lower electrode 321 can be located on the second lens areas BNE, RNE, and GNE of each pixel area PA. Between the second emission areas BE2, RE2 and GE2, the bank insulating layer 160 can be located between the second lower electrode 321 and the second light emitting layer 322. Between the second emission areas BE2, between the second emission areas RE2, and/or between the second emission areas GE2, the bank insulating layer 160 can be located between the second lower electrode 321 and the second light emitting layer 322. The second light emitting layer 322 can be spaced apart from the second lower electrode 321 by the bank insulating layer 160 between the second emission areas BE2, RE2, and GE2 of the respective second lens areas BNE, RNE, and GNE. In this situation, emission efficiency of the second emission areas BE2, RE2, and GE2 can be improved.

In an example embodiment, an area of each of the second emission areas BE2, RE2, and GE2 located within the second lens areas BNE, RNE, and GNE of the pixel area PA can be set to a specific value. For example, the areas of each of the second emission areas BE2, RE2, and GE2 located within the second lens areas BNE, RNE, and GNE can be implemented to be equal to each other, but embodiments are not limited thereto. The area of each of the second emission areas BE2, RE2, and GE2 located within the second lens areas BNE, RNE, and GNE of the pixel area PA can be equal to those of the second emission areas BE2, RE2, and GE2 included in the second lens areas BNE, RNE, and GNE of the adjacent pixel area PA, but embodiments are not limited thereto.

In an example embodiment, the number of the second emission areas can be different for each of the sub-pixel areas RPA, GPA, and BPA. For example, the number of the second emission areas BE2 defined within the second lens area BNE of the blue sub-pixel area BPA can be greater than the number of the second emission areas RE2 defined within the second lens area RNE of the red sub-pixel area RPA. The number of the second emission areas RE2 defined within the second lens area RNE of the red sub-pixel area RPA can be greater than the number of the second emission areas GE2 defined within the second lens area GNE of the green sub-pixel area GPA. In this situation, an efficiency difference of the second light emitting elements 320 located on the second lens areas BNE, RNE, and GNE of the pixel area PA can be supplemented by the number of the second emission areas BE2, RE2, and GE2 defined within the second lens areas BNE, RNE and GNE of each pixel area PA.

In an example embodiment, the sizes of the first emission areas BE1, RE1, and GE1 can be different for the respective sub-pixel areas RPA, GPA, and BPA. For example, the first emission area BE1 of the blue sub-pixel area BPA can have a size different from that of the first emission area RE1 of the red sub-pixel area RPA, and can have a size different from that of the first emission area GE1 of the green sub-pixel area GPA. The size of the first emission area BE1 of the blue sub-pixel area BPA can be greater than the size of the first emission area RE1 of the red sub-pixel area RPA. The size of the first emission area RE1 of the red sub-pixel area RPA can be greater than the size of the first emission area GE1 of the green sub-pixel area GPA. Accordingly, in the display device according to an example embodiment of the present disclosure, a difference in efficiency of the first light emitting elements 310 located on the first lens areas BWE, RWE, and GWE of each pixel area PA can be compensated for by the sizes of the first emission areas BE1, RE1, and GE1 defined within the first lens areas BWE, RWE, and GWE of each pixel area PA.

In an example embodiment, a lens protective layer 700 can be located on the first lens 510 and the second lens 520 in the pixel area PA. The lens protective layer 700 can include an insulating material. For example, the lens protective layer 700 can include an organic insulating material. A refractive index of the lens protective layer 700 can be smaller than a refractive index of the first lens 510 and a refractive index of the second lens 520 located in each pixel area PA. Accordingly, in the display device according to an example embodiment of the present disclosure, light passing through the first lens 510 and the second lens 520 of each pixel area PA may not be reflected in a direction back toward the substrate 10 due to a difference in refractive index with the lens protective layer 700. In this way, luminance and light extraction efficiency can be improved.

The gate driver according to an example embodiment of the present disclosure can include a scan driver and an emission driver. The scan driver can generate scan signals (e.g., an n-th first scan signal Scan1($n$) and an n-th second scan signal Scan2($n$)). The emission driver can generate an emission signal (e.g., a common emission signal EM($n$), a first mode signal S(k), and a second mode signal P(k)).

Figure 10:
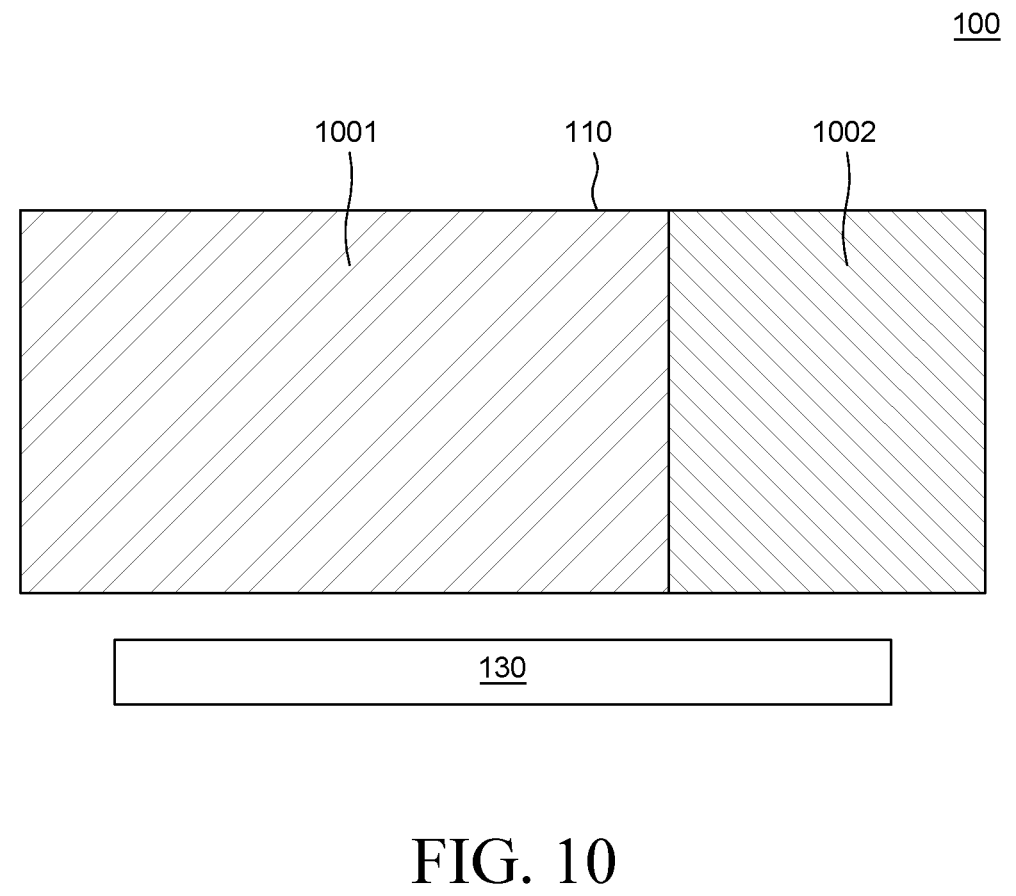

FIG. 10 is a conceptual view for explaining the display device according to an example embodiment of the present disclosure. Hereinafter, content that overlaps with the content described above can be omitted.

Referring to FIG. 10, the display device 100 can include the display panel 110 and a data driver 130. The display panel 110 and the data driver 130 can be electrically connected to each other. The display panel 110 and the data driver 130 can exchange various signals based on connection.

In an example embodiment, the display panel 110 can include a first area 1001 and a second area 1002. The first area 1001 is an area that operates in the first mode (e.g., wide angle viewing mode or sharing mode), and the second area 1002 is an area that operates in the first mode or the second mode (e.g., can switching between the wide angle viewing mode (sharing mode) and the narrow angle viewing mode (privacy mode)). Sizes of the first area 1001 and the second area 1002 can be changed. For example, the first area 1001 can be changed to be smaller or greater than the size shown, and the second area 1002 can be changed to be greater or smaller than the size shown according to the change in size of the first area 1001.

The first mode can refer to an operation mode of the display panel in which a viewing angle has a first value. The second mode can include an operation mode of the display panel in which the viewing angle has a second value smaller than the first value. When the display panel operates in the second mode, the field of view in which content is displayed can be limited to a specific range. For example, when the second area 1002 operates in the second mode, only users located within a predetermined distance range from the second area 1002 can view content displayed on the second area 1002. When the second area 1002 operates in the first mode, users within a wider range compared to the situation of operating in the second mode can view content displayed in the second area 1002.

According to an example embodiment, the first area 1001 can operate in the first mode or the second mode. In this situation, a gamma signal according to a mode in which the first area 1001 operates, for example, a first gamma signal can be provided when the first area 1001 operates in the first mode, and a second gamma signal can be provided when the first area 1001 operates in the second mode.

In an example embodiment, the display device 100 can be disposed in a vehicle. The first area 1001 of the display device 100 can be disposed adjacent to a driver seat, and the second area 1002 thereof can be disposed adjacent to a passenger seat. The first area 1001 can operate in the first mode and the second area 1002 can operate in the second mode. In this situation, content displayed in the first area 1001 can be viewed by both the driver seat and the passenger seat, and content displayed in the second area 1002 can be visible only to the passenger seat, e.g., except for the driver seat. In this way, driving safety can be improved, since the driver can be prevented from viewing the content that is being watched by the passenger on the second area 1002.

In an example embodiment, the data driver 130 can be singularly configured and connected to the display panel 110. The data driver 130 is connected to the display panel 110 and can control an operation of the display panel 110. The data driver 130 can provide various signals related to driving of the display panel 110 to the display panel 110. A more detailed description related to the data driver 130 will be provided with reference to FIG. 11.

In an example embodiment, the data driver 130 can be referred to as a source driver, but is not limited to the term.

Figure 11:
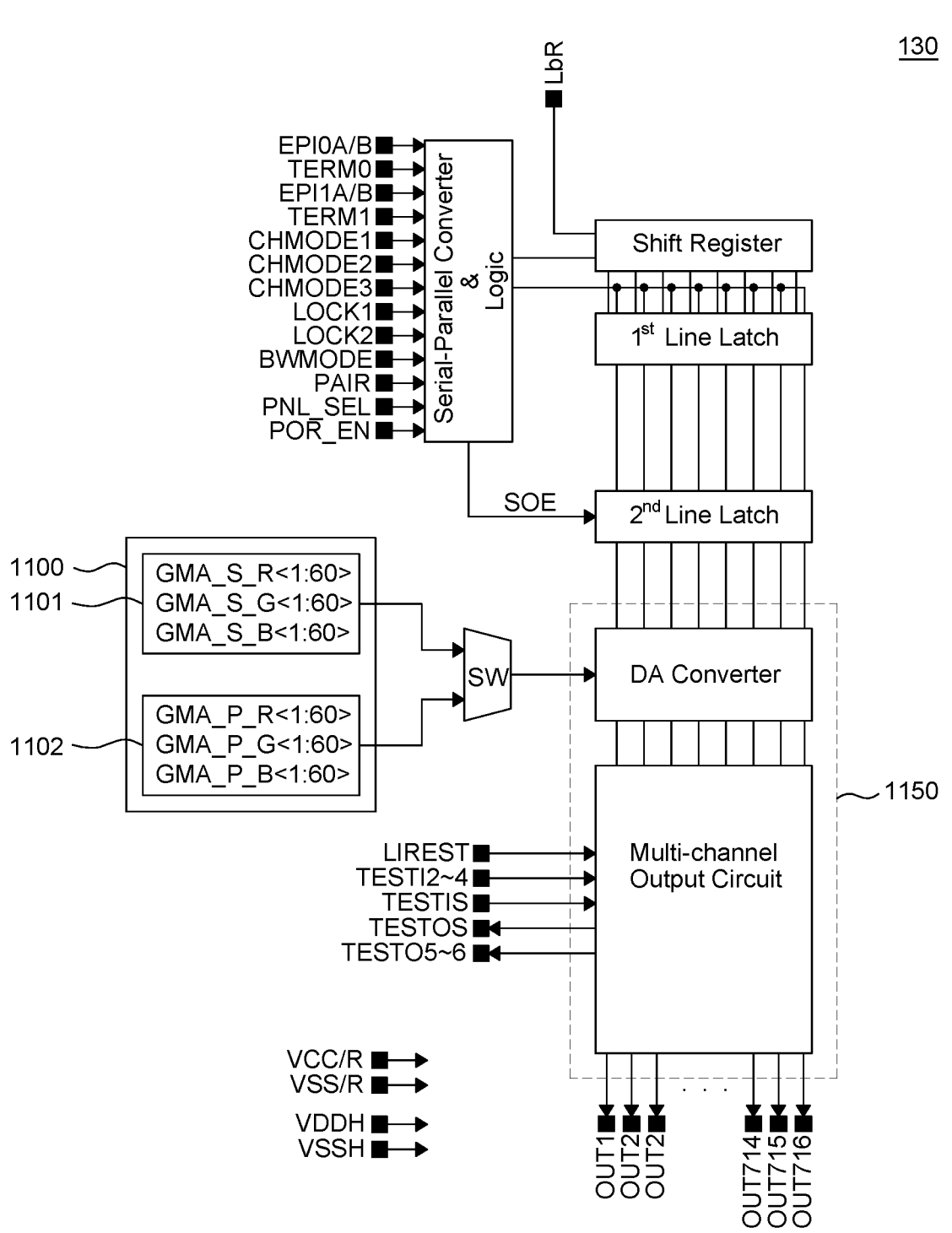
FIG. 11 shows an example of a data driver of the display device according to an example embodiment of the present disclosure.

FIG. 11 shows an example of a data driver of the display device according to an example embodiment of the present disclosure. Hereinafter, content that overlaps with the content described above may be omitted.

Referring to FIG. 11, the data driver 130 can include a gamma signal unit 1100 that generates a first gamma signal 1101 and a second gamma signal 1102. For example, the data driver 130 can include the gamma signal unit 1100 that generates a plurality of first gamma signals 1101 corresponding to the first mode of the display panel (e.g., sharing view mode) and mapped to different areas of the display panel, and a plurality of second gamma signals 1102 corresponding to the second mode of the display panel (e.g., privacy view mode) and mapped to different areas of the display panel.

The first gamma signal 1101 is a gamma signal corresponding to the first mode, and the second gamma signal 1102 is a gamma signal corresponding to the second mode. For example, the first gamma signal 1101 can be pre-specified as a gamma signal suitable for driving in the first mode. The second gamma signal 1102 can be pre-specified as a gamma signal suitable for driving in the second mode.

A gamma value is a value that determines correlation between brightness (gray level) of a signal input to the display panel and luminance of content (or image) displayed on the display panel. The gamma signal is a signal corresponding to the gamma value and can be pre-specified according to the gamma value. The first gamma value corresponding to the first mode and the second gamma value corresponding to the second mode can be pre-specified. The first gamma signal 1101 corresponds to the first gamma value and the second gamma signal 1102 corresponds to the second gamma value.

Referring to FIG. 11, each of the first gamma signal 1101 and the second gamma signal 1102 can exist for each color of the sub-pixels. For example, the first gamma signal 1101 can include GMA_S_R<1:60> corresponding to a red sub-pixel, GMA_S_G<1:60> corresponding to a green sub-pixel, and GMA_S_B<1:60> corresponding to a blue sub-pixel. The second gamma signal 1102 can include GMA_P_R<1:60> corresponding to the red sub-pixel, GMA_P_G<1:60> corresponding to the green sub-pixel, and GMA_P_B<1:60> corresponding to the blue sub-pixel.

In an example embodiment, an area of the display panel controlled by the data driver 130 can be divided into 60 areas. The data driver 130 is connected to each of the 60 areas and can provide the gamma signal to each of the 60 areas.

In this situation, the first gamma signal 1101 and the second gamma signal 1102 can exist in each of 60 areas. For example, GMA_S_R<1:60> can include 60 first gamma signals corresponding to red color, GMA_S_G<1:60> can include 60 first gamma signals corresponding to green color, and GMA_S_B<1:60> can include 60 first gamma signals corresponding to blue color. GMA_P_R<1:60> can include 60 second gamma signals corresponding to red color, GMA_P_G<1:60> can include 60 second gamma signals corresponding to green color, and GMA_P_B<1:60> can include 60 second gamma signals corresponding to the blue color.

The first gamma signal and the second gamma signal matched for each area can be different. For example, one first gamma signal and one second gamma signal can be matched for each of the 60 areas, and the matched first gamma signal and second gamma signal can be different.

Meanwhile, for convenience of explanation, the number of the signals is shown as 60, but it is not limited thereto.

According to an example embodiment, the signals can include 20 signals each for red, green, and blue colors, or can include signals greater than or less than 20 signals each for red, green, and blue colors.

The gamma signal unit 1100 can generate and store the above-described first gamma signal 1101 and second gamma signal 1102. According to an example embodiment, the gamma signal unit 1100 can be implemented as a separate configuration from the data driver 130. For example, the gamma signal unit 1100 can be included in a power unit that generates various power sources related to driving of the display device. In this situation, the gamma signal unit 1100 can be electrically connected to the data driver 130. The data driver 130 can perform operations related to the first gamma signal 1101 and the second gamma signal 1102, which will be described later, based on connection.

In an example embodiment, the gamma signal unit 1100 can generate the first gamma signal 1101 and/or second gamma signal 1102 which are the same as those shown in FIG. 14, which will be described later. For example, the first gamma signal 1101 can include GMA_S_R<1:10>, GMA_S_G<1:10>, and GMA_S_B<1:10>. The second gamma signal 1402 can include GMA_P_R<1:10>, GMA_P_G<1:10>, and GMA_P_B<1:10>.

Figure 13:
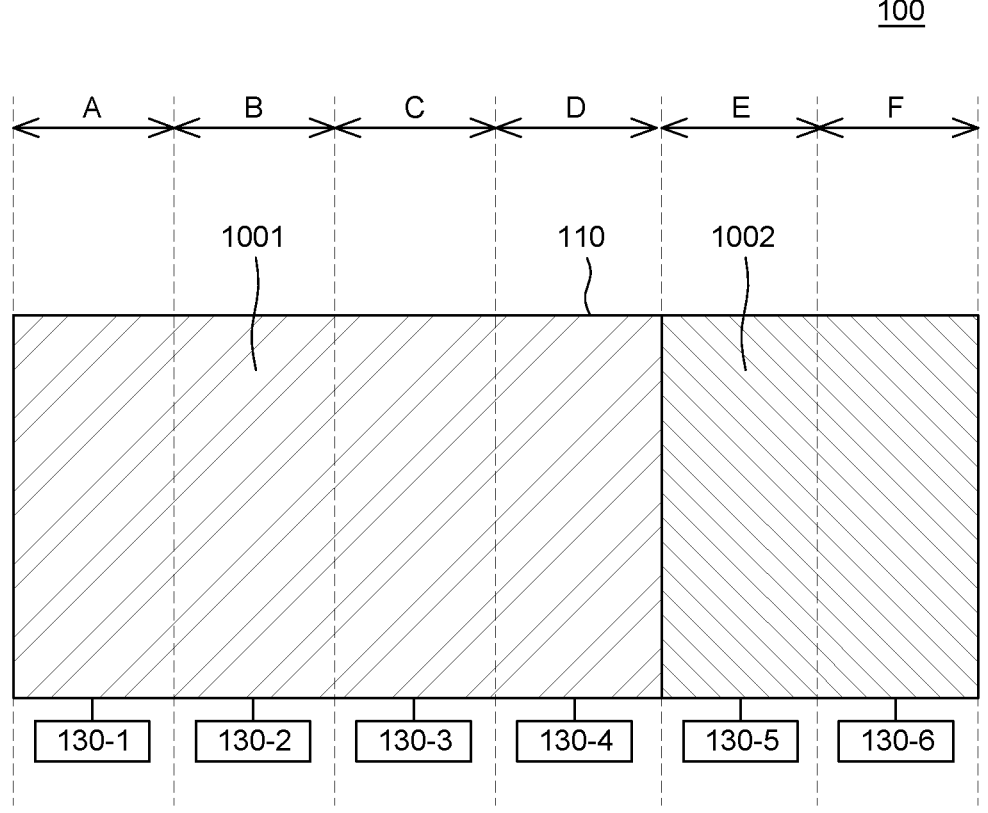
FIG. 13 is a conceptual view for explaining the display device according to an example embodiment of the present disclosure.

However, when there exists only one data driver 130 in one display panel as shown in FIG. 10, one data driver 130 should control a greater area compared to a situation where a plurality of data drivers 130 exist in one display panel as shown in FIG. 13. To this end, the data driver 130 receives the first gamma signal 1101 and/or the second gamma signal 1102 multiple times and can provide the first gamma signal 1101 and/or the second gamma signal 1102 to the pixel circuit included in the display panel, respectively.

Alternatively, the data driver 130 can be connected (or connected in parallel) to each of the pixel circuits included in the display panel and provide the same first gamma signal 1101 and/or second gamma signal 1102 to each of the pixel circuits based on the connection.

The data driver 130 can include a gamma switch SW. The gamma switch SW can select at least one signal to be output among the first gamma signal 1101 and the second gamma signal 1102.

In an example embodiment, the gamma switch SW can select an output signal from among the plurality of first gamma signals 1101 and the plurality of second gamma signals 1102 based on being connected to the gamma signal unit 1100. For example, the gamma switch SW can select at least part of the plurality of first gamma signals 1101 and at least part of the plurality of second gamma signals 1102 as output signals. For another example, the gamma switch SW can select the plurality of first gamma signals 1101 or the plurality of second gamma signals 1102 as output signals.

In an example embodiment, the gamma switch SW can select the plurality of first gamma signals 1101 as output signals based on the display panel being driven in the first mode (e.g., view sharing mode with a wide viewing angle). The gamma switch SW can select the plurality of second gamma signals 1102 as output signals based on the display panel being driven in the second mode (e.g., privacy view mode with a narrow viewing angle).

In an example embodiment, the first area (e.g., the first area 1001 in FIG. 10) of the display panel can operate in the first mode and the second area (e.g., the second area 1002 in FIG. 10) of the display panel can operate in the second mode. In this situation, the gamma switch SW can select the plurality of first gamma signals 1101 as output signals corresponding to the first area. The gamma switch SW can select the plurality of second gamma signals 1102 as output signals corresponding to the second area. In this situation, the data driver 130 can provide the plurality of first gamma signals 1101 to the first area and the plurality of second gamma signals 1102 to the second area.

In another example embodiment, the first area of the display panel can be driven in the first mode and the second area can be driven in the second mode. In this situation, the gamma switch SW can select a gamma signal corresponding to the first area among the plurality of first gamma signals 1101 as an output signal. For example, when the plurality of first gamma signals 1101 include a first gamma signal corresponding to each of 60 divided areas, the gamma switch SW can select, as an output signal, a first gamma signal of an area included in the first area among the 60 areas. Additionally, the gamma switch SW can select a gamma signal corresponding to the second area among the plurality of second gamma signals 1102 as an output signal. For example, when the plurality of second gamma signals 1102 include a second gamma signal corresponding to each of 60 divided areas, the gamma switch SW can select, as an output signal, a second gamma signal of an area included in the second area among the 60 areas.

The data driver 130 can include an output circuit 1150 that provides an output signal selected by the gamma switch SW to the display panel. When the output circuit 1150 receives a gamma signal from the gamma switch SW, it can transmit the received gamma signal to the display panel.

In an example embodiment, the output circuit 1150 can include a digital to analog (DA) converter and a multi-channel output circuit as shown. However, the present disclosure is not limited thereto, and the output circuit 1150 can be implemented to include additional components (e.g., a shift register, latches (a 1$^{st}$ line latch, a 2$^{nd}$ line latch)) or omit some components therefrom.

Figure 12:
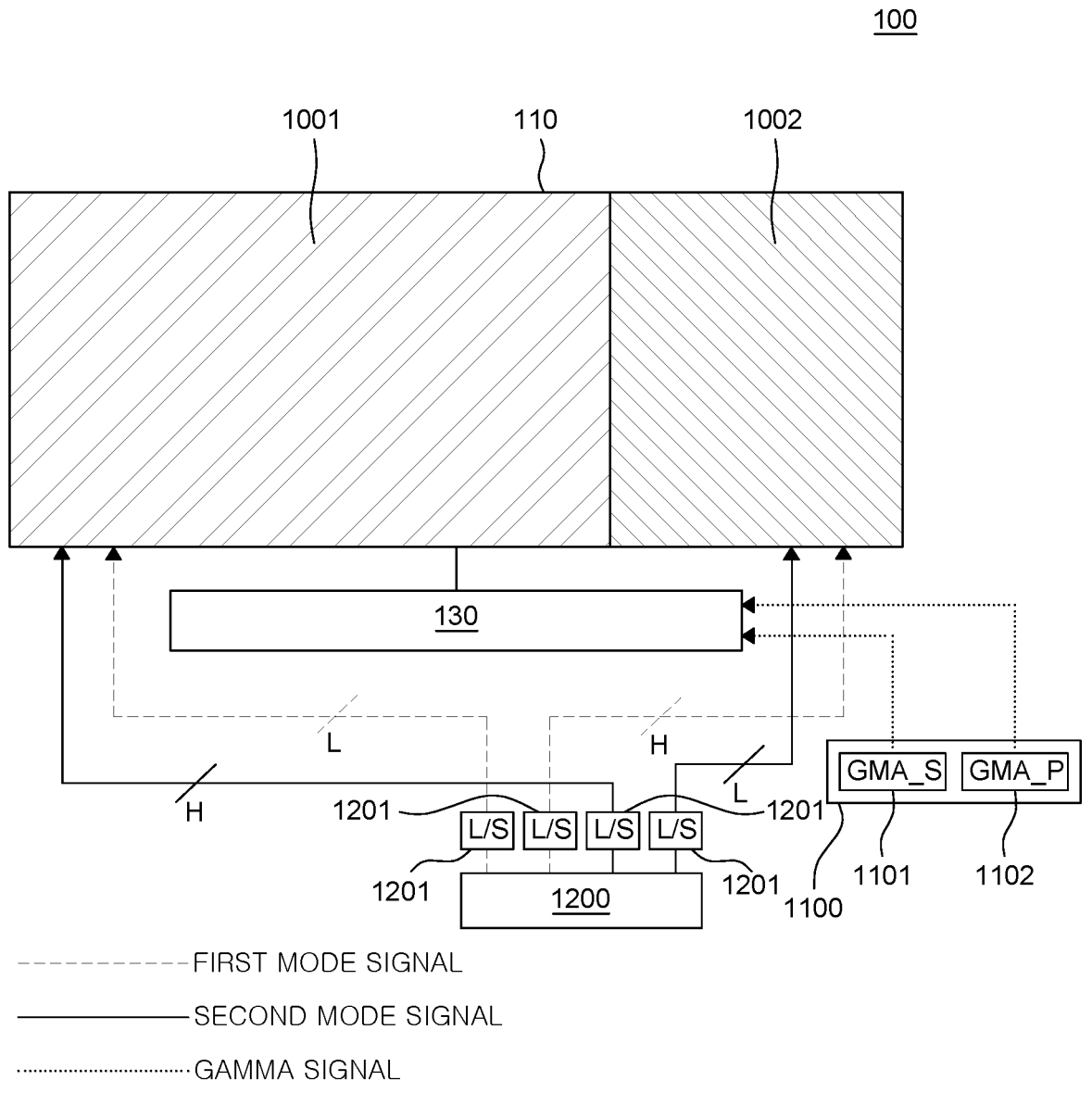
FIG. 12 is a view for explaining an operation of the display device according to an example embodiment of the present disclosure.

FIG. 12 is a view for explaining an operation of the display device according to an example embodiment of the present disclosure. FIG. 12 shows an example in which gamma signal unit 1100 is implemented as a separate configuration from the data driver 130, but it is not limited thereto. As explained in FIG. 11, the gamma signal unit 1100 can also be included in the data driver 130.

Referring to FIG. 12, the display device 100 can include the display panel 110, the data driver 130, and the mode controller 1200. The display panel 110 can include the first area 1001 operating in the first mode and the second area 1002 operating in the first mode or the second mode. The data driver 130 is connected to the display panel 110 and can provide a first gamma signal corresponding to the first mode to the first area 1001 and provide one of the first gamma signal corresponding to the first mode and the second gamma signal corresponding to the second mode to the second area 1002.

The mode controller 1200 can provide a signal for controlling the mode of the display panel 110 to the display panel 110. For example, the mode controller 1200 can provide a first mode signal for controlling the first mode and a second mode signal for controlling the second mode.

Each sub-pixel of the display panel 110 can include a pixel circuit, and the first mode signal and the second mode signal can be input to the pixel circuit. The pixel circuit can operate in the first mode when the first mode signal is input at a low-level and can operate in the second mode when the second mode signal is input at a low-level.

In an example embodiment, the first area 1001 of the display panel 110 can operate in the first mode and the second area 1002 can operate in the second mode. In this situation, as shown in FIG. 12, the mode controller 1200 can provide a low-level of the first mode signal and a high-level of the second mode signal to the pixel circuit disposed in the first area 1001. The mode controller 1200 can provide a low-level of the second mode signal and a high-level of the first mode signal to the pixel circuit disposed in the second area 1002.

According to an example embodiment, the display device 100 can include a level shifter 1201. The level shifter 1201 can change an output voltage of the first mode signal and/or the second mode signal. For example, the level shifter 1201 can change a low voltage (e.g., a logic voltage of 1.8V or 3.3V) output from the mode controller 1200 to a high voltage, e.g., a value within the range of VGL (−9.0V) to VGH (15.0V). The level shifter 1201 can be controlled by the mode controller 1200 to provide the first mode signal or the second mode signal.

In an example embodiment, the level shifter 1201 can be implemented for each of the first mode signal and the second mode signal provided to the first area 1001 and the second area 1002, respectively, as shown. However, the present disclosure is not limited thereto, and the level shifter 1201 can be implemented as one configuration according to an example embodiment and change a range of output voltages of the first mode signal and the second mode signal. Additionally, in some situations, the level shifter 1201 can be omitted or included in the mode controller 1200.

In an example embodiment, the display panel 110 can include a pixel circuit including a first light emitting element, a second light emitting element, and a plurality of transistors, a first lens disposed on the first light emitting element, and a second lens disposed on the second light emitting element. In this situation, the first area 1001 can operate in the first mode by transmitting light through the first lens as the first light emitting element emits light. The second area 1002 can operate in the second mode by transmitting light through the second lens, which has a smaller viewing angle than the first lens, as the second light emitting element emits light.

Additionally, in this situation, the data driver 130 can provide the first gamma signal to the first area 1001 and the second gamma signal to the second area 1002. For example, the data driver 130 can provide a first gamma signal corresponding to the first area 1001 among the plurality of first gamma signals 1101 to the first area 1001. The data driver 130 can provide a second gamma signal corresponding to the second area 1002 among the plurality of second gamma signals 1102 to the second area 1002.

In an example embodiment, the data driver 130 can include a gamma switch (e.g., the gamma switch SW in FIG. 11) configured to control the output of the first gamma signal 1101 corresponding to the first mode or the second gamma signal 1102 corresponding to the second mode. The data driver 130 can select the first gamma signal corresponding to the first area 1001 and the second gamma signal corresponding to the second area 1002 from the gamma signal unit 1100 using the gamma switch. The data driver 130 can provide the selected first and second gamma signals to the display panel 110.

For example, the first gamma signal 1101 and the second gamma signal 1102 can each be composed of signals corresponding to 60 areas of the display panel 110. The data driver 130 can select the first gamma signal that matches with an area included in the first area 1001 among the 60 first gamma signals 1101. The data driver 130 can select the second gamma signal that matches with an area included in the second area 1002 among the 60 second gamma signals

1102. The data driver 130 can provide the selected first and second gamma signals to the display panel 110. In other words, different gamma signals can be provided to different areas of the display.

Here, selection of the first gamma signal and the second gamma signal can be performed using the gamma switch included in the data driver 130. The gamma switch can be implemented as a physical switch between the gamma signal unit 1100 and the output circuit of the data driver 130 (e.g., the output circuit 1150 of FIG. 11). However, it is not limited thereto and of course, it can be implemented as a software switch.

In an example embodiment, the data driver 130 can select an appropriate gamma signal using the gamma switch based on information about the first area 1001 and the second area 1002 and information about the mode for each area. The data driver 130 can control the gamma switch based on information about the first area 1001 and the second area 1002 and information about the mode for each area. The gamma switch can select the first gamma signal and the second gamma signal suitable for each of the first area 1001 and the second area 1002 based on the control of the data driver 130.

The first gamma signal is a signal preset to be suitable for displaying content in the first mode, and the second gamma signal is a signal preset to be suitable for displaying content in the second mode. Accordingly, the display device according to an example embodiment of the present disclosure can further improve content display quality by being configured to provide a gamma signal suitable for each mode.

FIG. 13 is a conceptual view for explaining the display device according to an example embodiment of the present disclosure. FIG. 13 shows an example where a plurality of data drivers are configured.

Referring to FIG. 13, the display device 100 can include a plurality of data drivers 130-1, 130-2, 130-3, 130-4, 130-5, and 130-6. Each of the plurality of data drivers 130-1, 130-2, 130-3, 130-4, 130-5, and 130-6 can control different areas of the display panel 110. For example, a first data driver 130-1 can control area A, and a second data driver 130-2 can control area B. A third data driver 130-3 can control area C, and a fourth data driver 130-4 can control area D. A fifth data driver 130-5 can control area E, and a sixth data driver 130-6 can control area F. The areas A, B, C, and D can be included in the first area 1001, and the areas E and F can be included in the second area 1002, but embodiments are not limited thereto.

Each of the plurality of data drivers 130-1, 130-2, 130-3, 130-4, 130-5, and 130-6 can be implemented to have the same configuration, but embodiments are not limited thereto.

Figure 14:
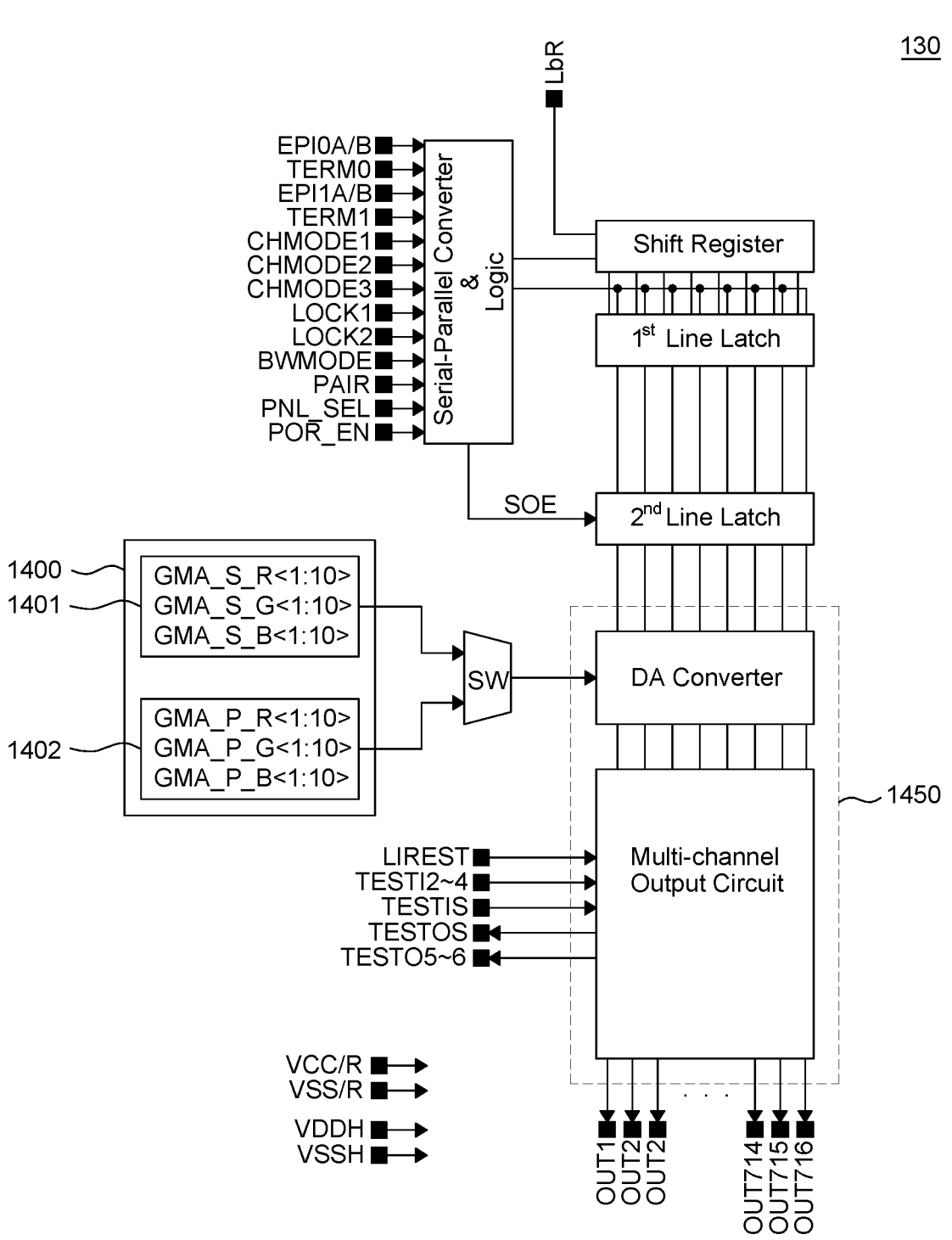
FIG. 14 shows an example of a data driver of a display device according to another example embodiment of the present disclosure.

FIG. 14 shows an example of a data driver of a display device according to another example embodiment of the present disclosure. FIG. 14 exemplarily shows one of the plurality of data drivers 130-1, 130-2, 130-3, 130-4, 130-5, and 130-6 of FIG. 13, and remaining data drivers can be implemented to have the same configuration. In addition, hereinafter, content that overlaps with the content described above may be omitted.

Referring to FIG. 14, the data driver 130 can include a gamma signal unit 1400, a gamma switch SW, and an output circuit 1450. The gamma signal unit 1400 can be implemented as a separate configuration according to an example embodiment.

The gamma signal unit 1400 can include a first gamma signal 1401 and a second gamma signal 1402. The first gamma signal 1401 can exist for each color of the sub-pixel. For example, the first gamma signal 1401 can include GMA_S_R<1:10> corresponding to a red sub-pixel, GMA_S_G<1:10> corresponding to a green sub-pixel, and GMA_S_B<1:10> corresponding to a blue sub-pixel. The second gamma signal 1402 can include GMA_P_R<1:10> corresponding to the red sub-pixel, GMA_P_G<1:10> corresponding to the green sub-pixel, and GMA_P_B<1:10> corresponding to the blue sub-pixel.

In an example embodiment, an area of the display panel controlled by the data driver 130 can be divided into 10 areas. The data driver 130 is connected to each of the 10 areas and can provide a gamma signal to each of the 10 areas.

In this situation, the first gamma signal 1401 and the second gamma signal 1402 can exist in each of the 10 areas. For example, GMA_S_R<1:10> can include 10 first gamma signals corresponding to red color, GMA_S_G<1:10> can include 10 first gamma signals corresponding to green color, and GMA_S_B<1:10> can include 10 first gamma signals corresponding to blue color. GMA_P_R<1:10> can include 10 second gamma signals corresponding to red color, GMA_P_G<1:10> can include 10 second gamma signals corresponding to green color, and GMA_P_B<1:10> can include 10 second gamma signals corresponding to blue color.

The first gamma signal and the second gamma signal matched for each area can be different from each other. For example, one first gamma signal and one second gamma signal can be matched for each of the 10 areas, and the matched first gamma signal and second gamma signal can be different.

In an example embodiment, a corresponding area for each gamma signal can be pre-specified. For example, in the situation of 1-1 gamma signals, e.g., GMA_S_R<1:1>, GMA_S_G<1:1>, and GMA_S_B<1:1>, they can correspond to the first area among areas controlled by the data driver 130. In the situation of 1-2 gamma signals, e.g., GMA_P_R<1:2>, GMA_P_G<1:2>, and GMA_P_B<1:2>, they can correspond to the second area among the areas controlled by the data driver 130. Each of the first area to the tenth area can be pre-specified.

In an example embodiment, GMA_S_R<1:1> can be referred to as GMA_S_R<1>, and GMA_S_R<1:2> can be referred to as GMA_S_R<2>. GMA_S_G<1:1> can be referred to as GMA_S_G<1>, and GMA_P_G<1:2> can be referred to as GMA_P_G<2>. GMA_P_B<1:1> can be referred to as GMA_P_B<1>, and GMA_P_B<1:2> can be referred to as GMA_P_B<2>.

The gamma switch SW can select an output signal among a plurality of first gamma signals 1401 and a plurality of second gamma signals 1402 according to an operation method of the area of the display panel controlled by the data driver 130. For example, the gamma switch SW can select the first gamma signal 1401 as an output signal when an entire area controlled by the data driver 130 is set to be in the first mode (e.g., the view sharing mode with a wide viewing angle). The gamma switch SW can select the second gamma signal 1402 as an output signal when the entire area controlled by the data driver 130 is in the second mode (e.g., the privacy view mode with a narrow viewing angle). As another example, when a part of the area controlled by the data driver 130 is in the first mode, the gamma switch SW can select the first gamma signal corresponding to the first mode as an output signal. When a part of the area controlled by the data driver 130 is in the second mode, the gamma switch SW can select the second gamma signal corresponding to the second mode as an output signal.

According to an example embodiment, the number of areas of the display panel controlled by the data driver 130 can be changed or adjusted. For example, rather than being divided into 10 areas as described, the number of areas of the display panel controlled by the data driver 130 can be greater than or less than 10 areas. However, even in this situation, the present embodiment is not limited.

When the output circuit 1450 receives a gamma signal from the gamma switch SW, it can transmit the received gamma signal to the display panel.

Figure 15:
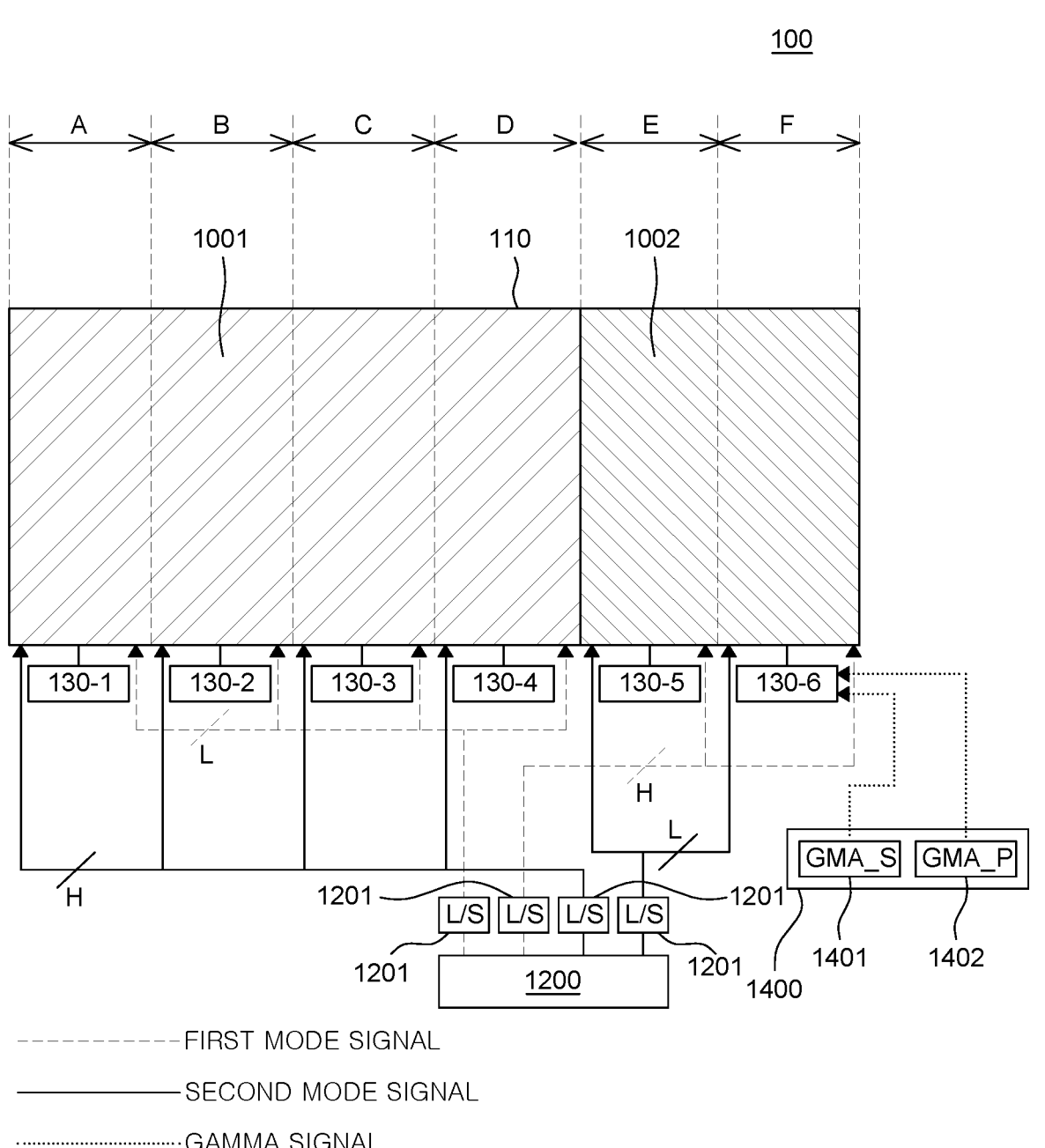
FIGS. 15 to 17 are views illustrating operations of a display device according to another example embodiment of the present disclosure.
Figure 16:
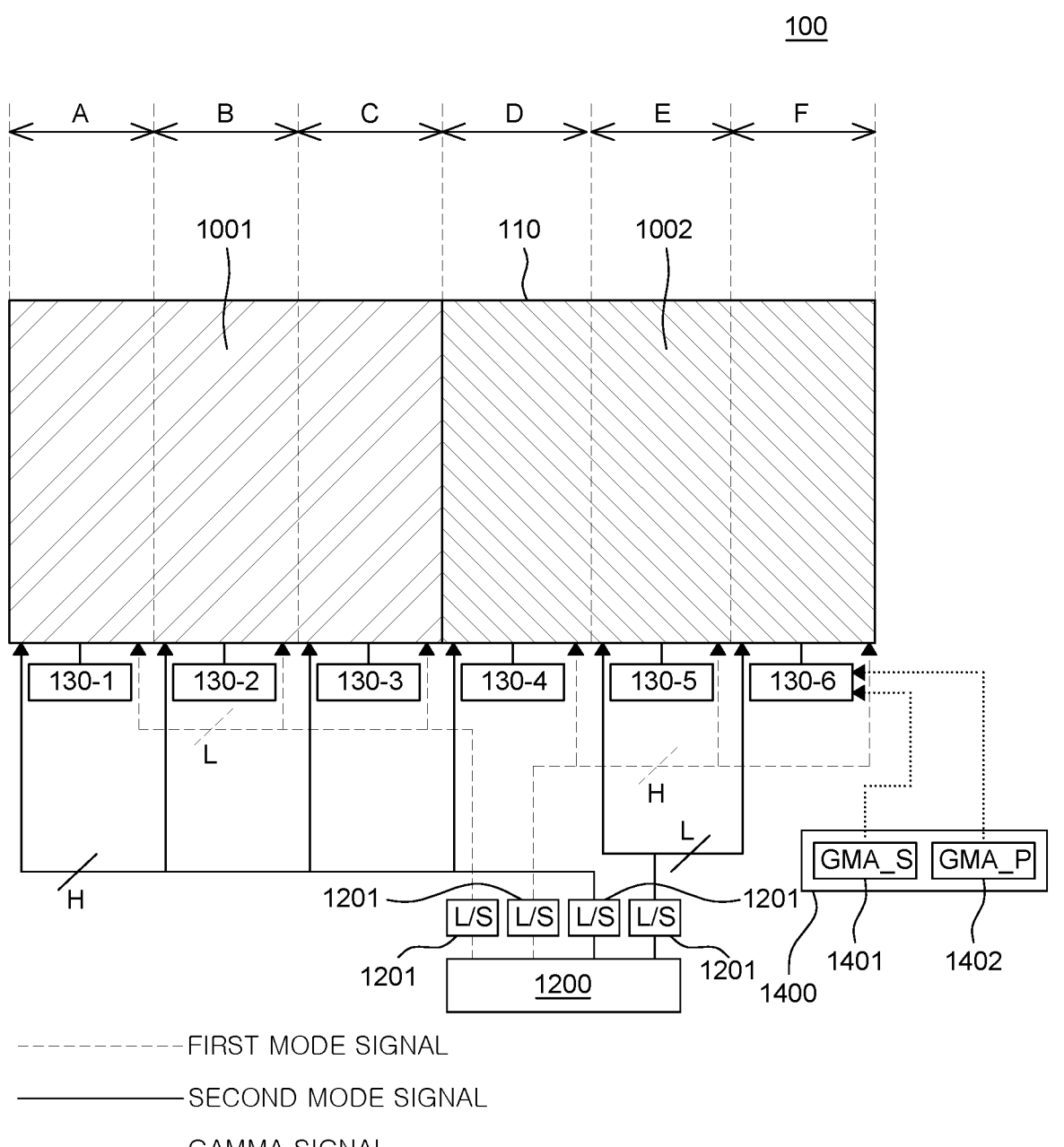
Figure 17:
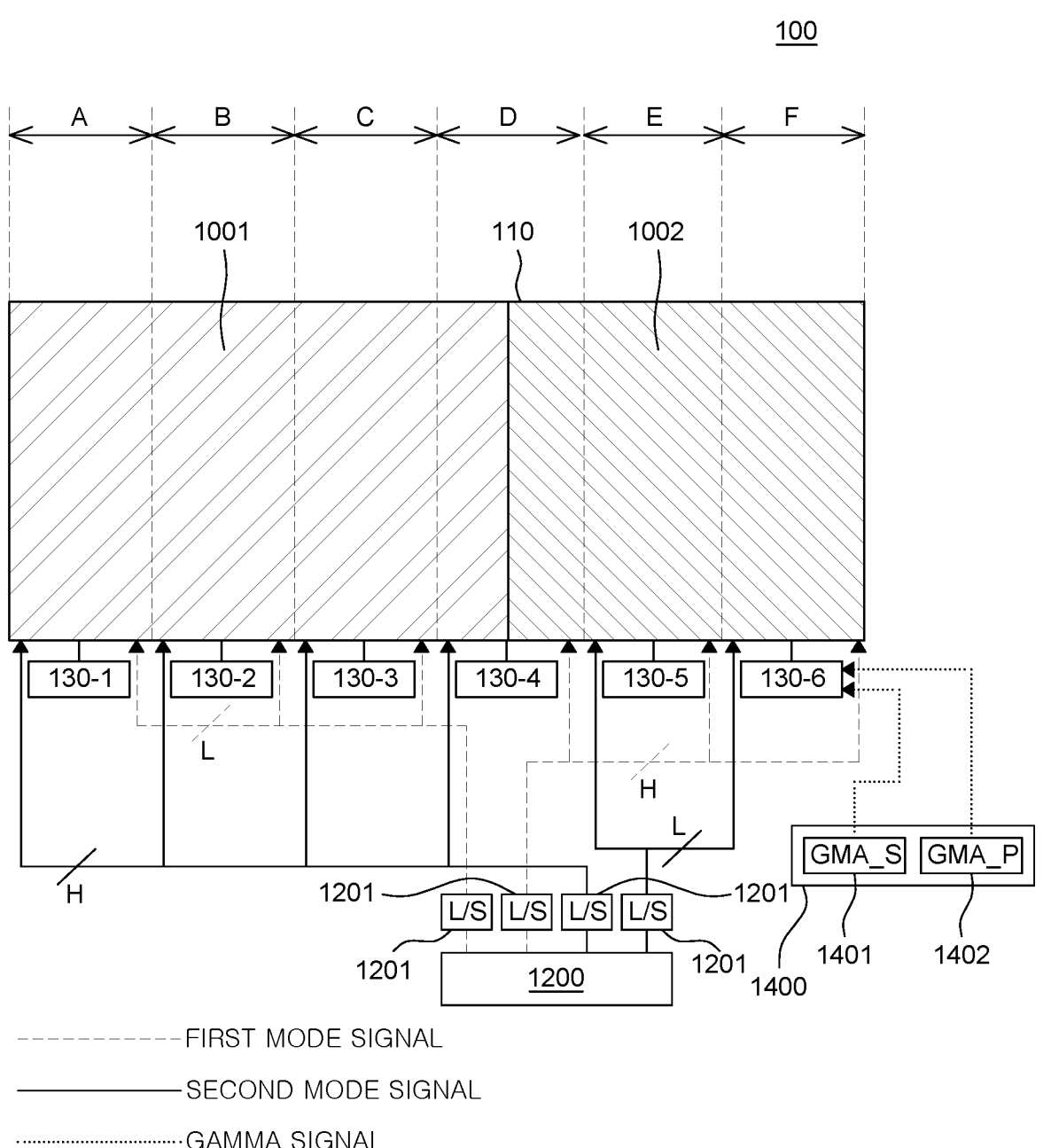

FIGS. 15 to 17 are views illustrating operations of a display device according to another example embodiment of the present disclosure. FIGS. 15 to 17 show examples of the display device 100 where each of the first area 1001 and the second area 1002 is divided into a plurality of areas as shown in FIG. 13, and data drivers 130-1 to 130-6 for controlling each area are included. For example, according to an embodiment, parts of the display for displaying content according to the first mode (e.g., wide viewing angle) and parts of the display for displaying content according to the second mode (e.g., narrow viewing angle) can be changed and variously adjusted. Hereinafter, content that overlaps with the content described above may be omitted.

Referring to FIG. 15, the first area 1001 is divided into four areas, e.g., areas A, B, C, and D, and the first area 1001 can be connected to data drivers 130-1 to 130-4 that control each divided area. The second area 1002 is divided into two areas, e.g., areas E and F, and the second area 1002 can be connected to data drivers 130-5 to 130-6 that control each divided area.

In an example embodiment, the mode controller 1200 can control an operation in the first mode (e.g., wide viewing angle) or the second mode (e.g., narrow viewing angle) for each area. For example, the mode controller 1200 can control the first area 1001 to operate in the first mode and the second area 1002 to operate in the second mode. In this situation, the mode controller 1200 uses the level shifter 1201 to provide a first mode signal with a low-level to the first area 1001 and a second mode signal with a low-level to the second area 1002. In addition, the mode controller 1200 uses the level shifter 1201 to provide a second mode signal with a high-level to the first area 1001 and to provide a first mode signal with a high-level to the second area 1002.

In an example embodiment, each of the data drivers 130-1 to 130-6 can be electrically connected to the gamma signal unit 1400. Each of the data drivers 130-1 to 130-6 can include a gamma switch for selecting a gamma signal. Accordingly, each of the data drivers 130-1 to 130-6 can select a gamma signal corresponding to a driving mode of the area connected thereto and provide it to the connected area.

For example, when the first area 1001 is driven in the first mode and the second area 1002 is driven in the second mode, the first data driver 130-1 can provide the first gamma signal 1401 to area A. The second data driver 130-2 can provide the first gamma signal 1401 to area B. The third data driver 130-3 can provide the first gamma signal 1401 to area C. The fourth data driver 130-4 can provide the first gamma signal 1401 to area D. The fifth data driver 130-5 can provide the second gamma signal 1402 to area E. The sixth data driver 130-6 can provide the second gamma signal 1402 to area F.

Here, the first gamma signal 1401 and the second gamma signal 1402 can be pre-specified according to characteristics of the data drivers 130-1 to 130-6 and areas connected thereto. For example, configurations of each of the data drivers 130-1 to 130-6 can correspond to each other, and sizes of control areas thereof can also correspond to each other. In this situation, the size of the control area for each of the data drivers 130-1 to 130-6 can be smaller than that of the data driver 130 of FIG. 12 described above.

For example, the data driver 130 of FIG. 12 controls an entirety of the first area 1001 and the second area 1002, but each of the data drivers 130-1 to 130-6 of FIG. 15 can control an area equal to ⅙ of the entirety of the first area 1001 and the second area 1002, e.g., an area corresponding to one of areas A to F.

In this situation, the number of gamma signals used to control the area can vary. For example, the data driver 130 of FIG. 12 uses 60 first gamma signals 1401 to control the connected area, but each of the data drivers 130-1 to 130-6 of FIG. 15 can use 10 first gamma signals 1401 to control the connected area. The gamma signal unit 1400 can pre-determine the number of the first gamma signals 1401 and the second gamma signals 1402 in consideration of the data drivers 130-1 to 130-6 and the connected areas A to F.

In an example embodiment, each of the first gamma signal 1401 and the second gamma signal 1402 can exist separately for each color of the sub-pixels. For example, the first gamma signal 1401 can include 10 first gamma signals corresponding to a red sub-pixel, 10 first gamma signals corresponding to a green sub-pixel, and 10 first gamma signals corresponding to a blue sub-pixel. The second gamma signal 1402 can include 10 second gamma signals corresponding to the red sub-pixel, 10 second gamma signals corresponding to the green sub-pixel, and 10 second gamma signals corresponding to the blue sub-pixel. In this situation, for example, when the first area 1001 is driven in the first mode, the first data driver 130-1 can provide 10 first gamma signals corresponding to the red sub-pixel, 10 first gamma signals corresponding to the green sub-pixel and 10 first gamma signals corresponding to the blue sub-pixel, that is, a total of 30 first gamma signals, to the area A. This also applies to the remaining data drivers 130-2 to 130-4.

In an example embodiment, the number of channels of the level shifter 1201 can be disposed corresponding to the number of mode signals provided for each area. For example, as shown in the level shifter 1201, the mode signals provided to each of the first area 1001 and the second area 1002 are a first mode signal and a second mode signal, that is, two mode signals, two channels for each area can be disposed.

In an example embodiment, the mode controller 1200 can provide a selection signal to each of the data drivers 130-1 to 130-6. The selection signal can be a signal configured to select a mode of an area of the display panel connected to each of the data drivers 130-1 to 130-6. For example, a first mode selection signal can be provided to the first data driver 130-1. In this situation, the first data driver 130-1 can allow the connected area to operate in the first mode (e.g., wide viewing angle). If a second mode selection signal is provided to the first data driver 130-1, the first data driver 130-1 can allow the connected area to operate in the second mode (e.g., narrow viewing angle).

In an example embodiment, signals for controlling the data drivers 130-2 to 130-6 can correspond to each other. For example, the mode controller 1200 can provide control signals to each of the data drivers 130-2 to 130-6 to control the data drivers 130-2 to 130-6. The control signals and/or control driving method can be the same for each of the data drivers 130-2 to 130-6.

Referring to FIG. 16, the sizes of the first area 1001 and the second area 1002 can change according to an example embodiment. According to an example embodiment, as shown, the size of the first area 1001 can decrease and the size of the second area 1002 can increase. For example, half of the entire display area can be operated in the first mode and the other half of the entire display area can be operated in the second mode. The data driver corresponding to the first area 1001 can include the first data driver 130-1, the second data driver 130-2, and the third data driver 130-3. The data driver corresponding to the second area 1002 can include the fourth data driver 130-4, the fifth data driver 130-5, and the sixth data driver 130-6.

In this situation, the mode controller 1200 can provide a low-level of the first mode signal and a high-level of the second mode signal to the first data driver 130-1, the second data driver 130-2, and the third data driver 130-3 as the first area 1001 is driven in the first mode. The mode controller 1200 can provide a low-level of the second mode signal and a high-level of the first mode signal to the fourth data driver 130-4, the fifth data driver 130-5, and the sixth data driver 130-6 as the second area 1002 is driven in the second mode.

In the situation of the fourth data driver 130-4, in an example embodiment of FIG. 15, the first gamma signal 1401 is selected and provided to the area D, but in an example embodiment of FIG. 16, the second gamma signal 1402 is selected and provided to the area D.

Referring to FIG. 17, according to an example embodiment, some data drivers can be related to driving of at least part of the first area 1001 and at least part of the second area 1002. Some other data drivers can be related to driving of the first area 1001 or the second area 1002.

For example, the areas A to C controlled by the first data driver 130-1 to third data driver 130-3 can be included in the first area 1001. A part of the area D controlled by the fourth data driver 130-4 can be included in the first area 1001, and another part of the area D can be included in the second area 1002. For example, half of the area D can be operated in the first mode and the other half of area D can be operated in the second mode. The areas E and F controlled by the fifth data driver 130-5 and the sixth data driver 130-6 can be included in the second area 1002.

The first data driver 130-1 to the third data driver 130-3 can provide the first gamma signal 1401 to areas corresponding thereto. The fifth data driver 130-5 and the sixth data driver 130-6 can provide the second gamma signal 1402 to areas corresponding thereto.

The fourth data driver 130-4 can identify area D-1 included in the first area 1001 and area D-2 included in the second area 1002 in the area D. The fourth data driver 130-4 can control the area D by dividing it into area D-1 and area D-2.

For example, the fourth data driver 130-4 can provide the first gamma signal 1401 to the area D-1 and the second gamma signal 1402 to the area D-2. For example, the fourth data driver 130-4 can provide GMA_S_R<1:10>, GMA_S_G<1:10>, and GMA_S_B<1:10> to the area D-1. The fourth data driver 130-4 can provide GMA_P_R<1:10>, GMA_P_G<1:10>, and GMA_P_B<1:10> to the area D-2.

As another example, the fourth data driver 130-4 can provide a signal corresponding to the area D-1 in the first gamma signal 1401 to the area D-1 and a signal corresponding to the area D-2 in the second gamma signal 1402 to the area D-2. For example, the fourth data driver 130-4 can provide GMA_S_R<1:5>, GMA_S_G<1:5>, and GMA_S_B<1:5> to the area D-1. The fourth data driver 130-4 can provide GMA_P_R<5:10>, GMA_P_G<5:10>, and GMA_P_B<5:10> to the area D-2.

Here, GMA_S_R<1:5> is five red first gamma signals corresponding to the area D-1, GMA_S_G<1:5> is five green first gamma signals corresponding to the area D-1, and GMA_S_B<1:5> is five blue first gamma signals corresponding to the area D-1. GMA_P_R<5:10> is five red second gamma signals corresponding to the area D-2, GMA_P_G<5:10> is five green second gamma signals corresponding to the area D-2, and GMA_P_B<5:10> is five blue second gamma signals corresponding to the area D-2.

In an example embodiment, the fourth data driver 130-4 as well as the other data drivers 130-1 to 130-3, 130-5, and 130-6 can each divide the display panel into two or more areas and control them. For example, the first data driver 130-1, the second data driver 130-2, the third data driver 130-3, the fifth data driver 130-5, and the sixth data driver 130-6 can each divide the connected areas into two, like the fourth data driver 130-4 and selectively provide a gamma signal for each area.

That is, each of the data drivers 130-1 to 130-6 can select and provide the gamma signal provided from the gamma signal unit 1400 appropriately for the mode of the connected areas A to F. In this situation, the display quality of the display device can be improved by being configured to provide a gamma signal suitable for the mode.

The example embodiments of the present disclosure can also be described as follows:

According to an aspect of the present disclosure, a display device can comprise a display panel including a first area operating in a first mode and a second area operating in the first mode or a second mode and at least one data driver connected to the display panel and configured to provide a first gamma signal corresponding to the first mode to the first area and configured to provide one of the first gamma signal and a second gamma signal corresponding to the second mode to the second area, and the display panel includes, a pixel circuit including a first light emitting element, a second light emitting element, and a plurality of transistors, a first lens disposed on the first light emitting element; and a second lens disposed on the second light emitting element.

The data driver can include a gamma switch configured to control an output of the first gamma signal corresponding to the first mode or the second gamma signal corresponding to the second mode.

When the second area is driven in the second mode, the data driver can provide the first gamma signal to the first area using the gamma switch and can provide the second gamma signal to the second area using the gamma switch.

The data driver can include a first data driver, a second data driver, and a third data driver, and the first data driver can be related to driving of the first area, the second data driver can be related to driving of a part of the first area and a part of the second area, and the third data driver can be related to driving of the second area.

The first data driver can provide the first gamma signal to the display panel, the second data driver can provide the first gamma signal and the second gamma signal, and the third data driver can provide the second gamma signal.

The second data driver can provide the first gamma signal to the part of the first area and the second gamma signal to the part of the second area.

Sizes of the first area and the second area can be changeable or adjusted.

Each of the first area and the second area can include the pixel circuit, the first lens, and the second lens.

Also, a viewing angle of an area where the first lens can be disposed corresponds to a first value, and a viewing angle of an area where the second lens is disposed corresponds to a second value that is smaller than the first value.

The first light emitting element can emit light when operating in the first mode, and the second light emitting element can emit light when operating in the second mode.

According to another aspect of the present disclosure, a data driver connected to a display panel and configured to control an operation of the display panel, the data driver can comprise a gamma signal unit that generates a plurality of first gamma signals corresponding to a first mode of the display panel and mapped to different areas of the display panel, and a plurality of second gamma signals corresponding to a second mode of the display panel and mapped to different areas of the display panel, a gamma switch configured to select an output signal from among the plurality of first gamma signals and the plurality of second gamma signals based on being connected to the gamma signal unit; and an output circuit that provides the selected output signal to the display panel.

The gamma switch can select the plurality of first gamma signals as output signals based on the display panel being driven in the first mode and can select the plurality of second gamma signals as output signals based on the display panel being driven in the second mode.

The first mode can include a state in which a viewing angle of the display panel has a first value, and the second mode includes a state in which the viewing angle of the display panel has a second value smaller than the first value.

The display panel can include a first area operating in the first mode and a second area operating in the first mode or the second mode.

The display panel can include a pixel circuit including a first light emitting element, a second light emitting element, and a plurality of transistors; a first lens disposed on the first light emitting element; and a second lens disposed on the second light emitting element.

Although the example embodiments of the present disclosure have been described in detail with reference to the accompanying drawings, the present disclosure is not limited thereto and can be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. All the technical concepts in the equivalent scope of the present disclosure should be construed as falling within the scope of the present disclosure.

What is claimed is:

1. A display device, comprising:
a display panel including a first area configured to operate in a first mode, and a second area configured to operate in the first mode or a second mode; and
at least one data driver connected to the display panel and configured to:
output a first gamma signal corresponding to the first mode to the first area and,
output either the first gamma signal or a second gamma signal corresponding to the second mode to the second area,
wherein the display panel includes:
a pixel circuit including a first light emitting element, a second light emitting element, and a plurality of transistors;
a first lens disposed on the first light emitting element; and a second lens disposed on the second light emitting element, the second lens having a different shape than the first lens,
wherein the first mode is configured to drive the first light emitting element to provide a first viewing angle, and
the second mode is configured to drive the second light emitting element to provide a second viewing angle different from the first viewing angle.

2. The display device of claim 1, wherein the at least one data driver includes a gamma switch configured to selectively output the first gamma signal corresponding to the first mode or the second gamma signal corresponding to the second mode.

3. The display device of claim 2, wherein the at least one data driver is configured to:
in response to the second area being driven in the second mode, output the first gamma signal to the first area using the gamma switch and output the second gamma signal to the second area using the gamma switch.

4. The display device of claim 1, wherein the data driver includes a first data driver, a second data driver, and a third data driver, and
wherein the first data driver is configured to drive a first portion of the first area, the second data driver is configured to drive a second portion of the first area and a first portion of the second area, and the third data driver is configured to drive a second portion of the second area.

5. The display device of claim 4, wherein the first data driver provides the first gamma signal to the display panel,
wherein the second data driver provides the first gamma signal and the second gamma signal to the display panel, and
wherein the third data driver provides the second gamma signal to the display panel.

6. The display device of claim 5, wherein the second data driver provides the first gamma signal to the second portion of the first area and the second gamma signal to the first portion of the second area.

7. The display device of claim 1, wherein sizes of the first area and the second area are changeable.

8. The display device of claim 1, wherein each of the first area and the second area includes the pixel circuit, the first lens, and the second lens.

9. The display device of claim 1, wherein a viewing angle of an area where the first lens is disposed corresponds to a first value, and a viewing angle of an area where the second lens is disposed corresponds to a second value that is smaller than the first value.

10. The display device of claim 1, wherein the first light emitting element emits light when operating in the first mode, and
when the second light emitting element emits light when operating in the second mode.

11. A data driver for controlling an operation of a display panel, the data driver comprising:
a gamma signal unit configured to:
generate a plurality of first gamma signals corresponding to a first mode of the display panel, the plurality of first gamma signals being mapped to first areas of the display panel, and
generate a plurality of second gamma signals corresponding to a second mode of the display panel, the plurality of second gamma signals being mapped to second areas of the display panel;

a gamma switch configured to select an output signal from among the plurality of first gamma signals and the plurality of second gamma signals; and an output circuit configured to supply the output signal to the display panel, wherein the first mode is a mode in which the display panel operates with a viewing angle of a first value, and the second mode is a mode in which the display panel operates with a viewing angle of a second value.

12. The data driver of claim 11, wherein the gamma switch is further configured to select the plurality of first gamma signals as output signals based on the display panel being driven in the first mode, and select the plurality of second gamma signals as output signals based on the display panel being driven in the second mode.

13. The data driver of claim 12, wherein the first mode includes a state in which a viewing angle of the display panel has a first value, and the second mode includes a state in which the viewing angle of the display panel has a second value smaller than the first value.

14. The data driver of claim 13, wherein the display panel includes a first area configured to operate in the first mode and a second area configured to operate in the first mode or the second mode.

15. The data driver of claim 14, wherein the display panel includes:

a pixel circuit including a first light emitting element, a second light emitting element, and a plurality of transistors;

a first lens disposed on the first light emitting element; and a second lens disposed on the second light emitting element, the second lens having a different shape than the first lens.

16. A display device, comprising:

a display panel including a plurality of pixels, each of the plurality of pixels including a first light emitting element, a second light emitting element, a first lens disposed on the first light emitting element, and a second lens disposed on the second light emitting element having a different shape than the first lens, wherein the display panel including a first area configured to operate in a first mode, and a second area configured to operate in the first mode or a second mode, wherein the display device is configured to:

operate in the first mode by driving the first light emitting elements of the plurality of pixels in the first area for providing a first viewing angle, and operate in the second mode by driving the second light emitting elements of the plurality of pixels in the second area for providing a second viewing angle different than the first viewing angle.

17. The display device of claim 16, wherein display panel includes a first area and a second area, and wherein the first area is configured to operate in the first mode, and the second area is configured to operate in the second mode.

18. The display device of claim 17, wherein each of the plurality of pixels includes a first driving transistor configured to drive the first light emitting element, and a second driving transistor configured to drive the second light emitting element.

19. The display device of claim 18, wherein a first mode signal line configured to supply a first mode signal is connected to a first gate electrode of the first driving transistor, and wherein a second mode signal line configured to supply a second mode signal is connected to a second gate electrode of the second driving transistor.

20. The display device of claim 19, further comprising a gate driver configured to supply the first mode signal to pixels in the first area and supply the second mode signal to pixels in the second area.

21. A display device, comprising:

a display panel includes a plurality of pixels, each of the plurality of pixels including a first type of subpixel for operating in a first mode and a second type of subpixel for operating in a second mode;

a first type of lens disposed on the first type of subpixel; and a second type of lens disposed on the second type of subpixel, the second type of lens having a different shape than the first type of lens, wherein the display panel includes a first area configured to operate in a first mode, and a second area configured to operate in the first mode or a second mode, and wherein the first mode is configured to drive the first type of subpixel to provide a first viewing angle, and the second mode is configured to drive the second type of subpixel to provide a second viewing angle different from the first viewing angle.

22. The display device according to claim 21, wherein the first mode is a wide viewing angle mode, and the second mode is a narrow viewing angle mode.

23. The display device according to claim 21, wherein the display panel includes a first area configured to operate in the first mode and a second area configured to operate in the first mode and the second mode.

24. The display device according to claim 23, further comprising:

at least one data driver configured to adjust a first sizes of an area of the display that content according to the first mode and adjust a second size of another area of the display that displays content according to the second mode.

25. The display device according to claim 21, wherein the first lens has a semi-cylindrical shape and the second lens has a hemi-spherical shape.

26. The display device according to claim 21, further comprising:

at least one data driver configured to drive the display panel, wherein the at least one data driver includes a gamma switch configured to selectively output a first gamma signal corresponding to the first mode or a second gamma signal corresponding to the second mode.

* * * * *